United States Patent [19]

Van Maren

[11] Patent Number: 5,298,895
[45] Date of Patent: Mar. 29, 1994

[54] DATA COMPRESSION METHOD AND APPARATUS UTILIZING AN ADAPTIVE DICTIONARY

[75] Inventor: David J. Van Maren, Fort Collins, Colo.

[73] Assignee: Hewlett-Packard Company, Palo Alto, Calif.

[21] Appl. No.: 761,783

[22] Filed: Nov. 19, 1991

[30] Foreign Application Priority Data

Jan. 19, 1990 [GB] United Kingdom ............... 9001315
Feb. 8, 1990 [GB] United Kingdom ............... 9002882

[51] Int. Cl.$^5$ ............................................. H03M 7/30
[52] U.S. Cl. ......................................... 341/51; 341/55
[58] Field of Search ................. 341/51, 50, 59, 67, 341/87, 89, 90, 106, 65, 55; 360/39; 364/939, 939.3, 952.6

[56] References Cited

U.S. PATENT DOCUMENTS

| | | | |
|---|---|---|---|
| 4,847,619 | 7/1989 | Kato et al. | 341/106 |
| 4,891,784 | 1/1990 | Kato et al. | 364/900 |
| 5,151,697 | 9/1992 | Bunton | 341/51 |

FOREIGN PATENT DOCUMENTS 0324542  7/1989 European Pat. Off. .

OTHER PUBLICATIONS

"Data Compression in a Half-Inch Reel-to-Reel Tape Drive", Mark J. Bianchi et al., Hewlett-Packard Journal, vol. 40, No. 3, Jun. 1989, pp. 26–31.

"Minimizing Tape Capacity by Super Blocking", David J. Van Maren et al., Hewlett-Packard Journal, vol. 40, No. 3, Jun. 1989, pp. 32–34.

Primary Examiner—Brian K. Young

[57] ABSTRACT

The present invention provides a method and apparatus for compressing user data and for storing the user data on magnetic tape. The user data is accepted and organized into a plurality of records. The user data is then compressed according to a compression algorithm involving converting at least some of the user data to codewords using a dictionary which is derived from the data. The compressed data is flushed from memory before a new dictionary is created. The user data may be written to magnetic tape after being organized into groups, the groups being independent of the record organization. A codeword indicating the start of a new dictionary is inserted at the beginning of a group and preferably at the beginning of the first record within a group. Records may be further organized into entities. A codeword indicating a flush operation is inserted following each entity and a codeword indicating the start of a new dictionary is inserted at the beginning of the first entity within a group.

18 Claims, 25 Drawing Sheets

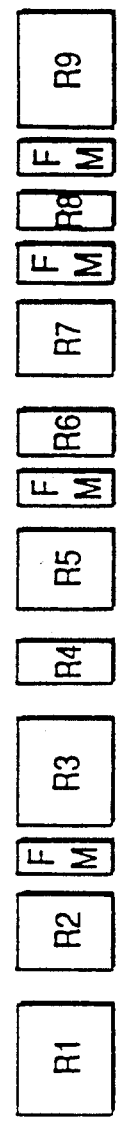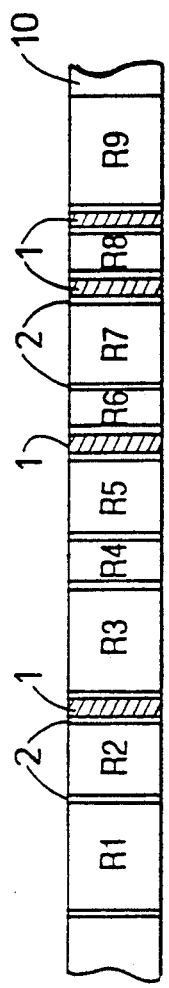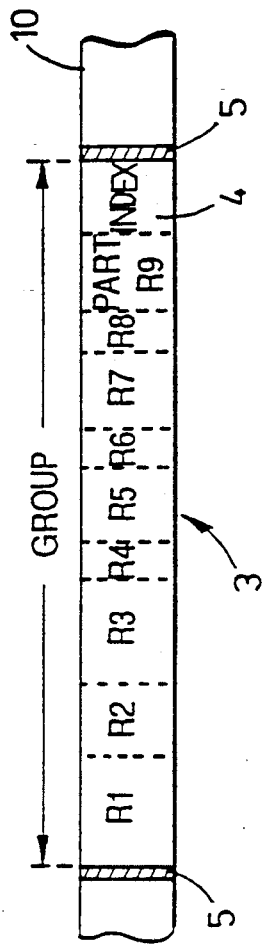
FIG 1(a) (PRIOR ART)
FIG 1(b) (PRIOR ART)
FIG 1(c) (PRIOR ART)

| FLAG | | | | | COUNT |
|---|---|---|---|---|---|
| SKP R | EX F O X R | CE OM T P | MB R R K | EO R R | |
| SEPARATOR MARK | 0 | 0 | 0 | X | 1 | 1 | 0,1 (SIGNIFY DIFFERENT MARK TYPES) |
| TOTALLY CONTAINED RECORD | 0 | 1 | 0 | X | 1 | 1 | FULL RECORD BYTE COUNT |
| START OF PART RECORD | 0 | 1 | 0 | X | 0 | 1 | FIRST PART BYTE COUNT |
| MIDDLE PART OF RECORD | 0 | 1 | 0 | X | 0 | 0 | MIDDLE PART BYTE COUNT |
| END PART OF RECORD | 0 | 1 | 1 | X | 0 | 0 | END PART BYTE COUNT |
| TOTAL COUNT | 0 | 0 | 0 | X | 0 | 1 | TOTAL RECORD BYTE COUNT |
| SKIP ENTRY | 1 | 0 | 0 | X | 0 | 0 | GROUP SIZE MINUS DATA AREA SIZE |

FIG 3 (PRIOR ART)

| FLAG | | | | | COUNT | |
|---|---|---|---|---|---|---|
| SKP | XFR | ECO MPX | EOT | MB OR RK | EOR | |
| ALGORITHM NUMBER | 0 | 0 | 0 | 1 | X | 0 | 0 | DC ALGORITHM # |
| SEPARATOR MARK | 0 | 0 | 0 | 0 | X | 1 | 1 | 0,1 (SIGNIFY DIFFERENT MARK TYPES) |
| TOTALLY CONTAINED RECORD | 0 | 1 | 1 | 1 | X | 1 | 1 | FULL RECORD COMPRESSED BYTE COUNT |
| START OF PART RECORD | 0 | 1 | 0 | 1 | X | 0 | 0 | FIRST PART COMPRESSED BYTE COUNT |
| MIDDLE PART OF RECORD | 0 | 1 | 0 | 1 | X | 1 | 0 | MIDDLE PART COMPRESSED BYTE COUNT |
| END PART OF RECORD | 0 | 1 | 1 | 1 | X | 0 | 0 | END PART COMPRESSED BYTE COUNT |
| TOTAL COUNT | 0 | 0 | 0 | 1 | X | 0 | 1 | TOTAL RECORD COMPRESSED BYTE COUNT |
| SKIP ENTRY | 1 | 0 | 0 | 0 | X | 0 | 0 | GROUP SIZE MINUS DATA AREA SIZE |

FIG 3A

| FLAG | COUNT |
|---|---|
| 0 1 1 0 X 0 1 1 | BC 1 |
| 0 1 1 0 X 0 1 1 | BC 2 |
| 0 0 0 0 X 1 1 1 | FM |
| 0 1 1 0 X 0 1 1 | BC 3 |
| 0 1 1 0 X 0 1 1 | BC 4 |
| 0 1 1 0 X 0 1 1 | BC 5 |
| 0 0 0 0 X 1 1 1 | FM |
| 0 1 1 0 X 0 1 1 | BC 6 |
| 0 1 1 0 X 0 1 1 | BC 7 |
| 0 0 0 0 X 1 1 1 | FM |
| 0 1 1 0 X 0 1 1 | BC 8 |
| 0 0 0 0 X 1 1 1 | FM |
| 0 1 0 0 X 0 1 0 | BC 9a |
| 1 0 0 0 X 0 0 0 | SKIP COUNT |

FIG 4 (PRIOR ART)

| FLAG | COUNT |
|---|---|
| 0 0 0 1 X 0 0 0 | ALG # |
| 0 1 1 0 X 0 1 1 | UBC 1 |
| 0 1 1 1 X 0 1 1 | CBC 2 |
| 0 0 0 0 X 1 1 1 | FM |
| 0 1 1 0 X 0 1 1 | UBC 3 |
| 0 1 1 1 X 0 1 1 | CBC 4 |
| 0 1 1 0 X 0 1 1 | UBC 5 |
| 0 0 0 0 X 1 1 1 | FM |
| 0 1 1 1 X 0 1 1 | CBC 6 |
| 0 1 1 0 X 0 1 1 | UBC 7 |
| 0 0 0 0 X 1 1 1 | FM |
| 0 1 1 1 X 0 1 1 | CBC 8 |
| 0 0 0 0 X 1 1 1 | FM |
| 0 1 0 0 X 0 1 0 | UBC 9a |
| 1 0 0 0 X 0 0 0 | SKIP ENTRY |

FIG 4A

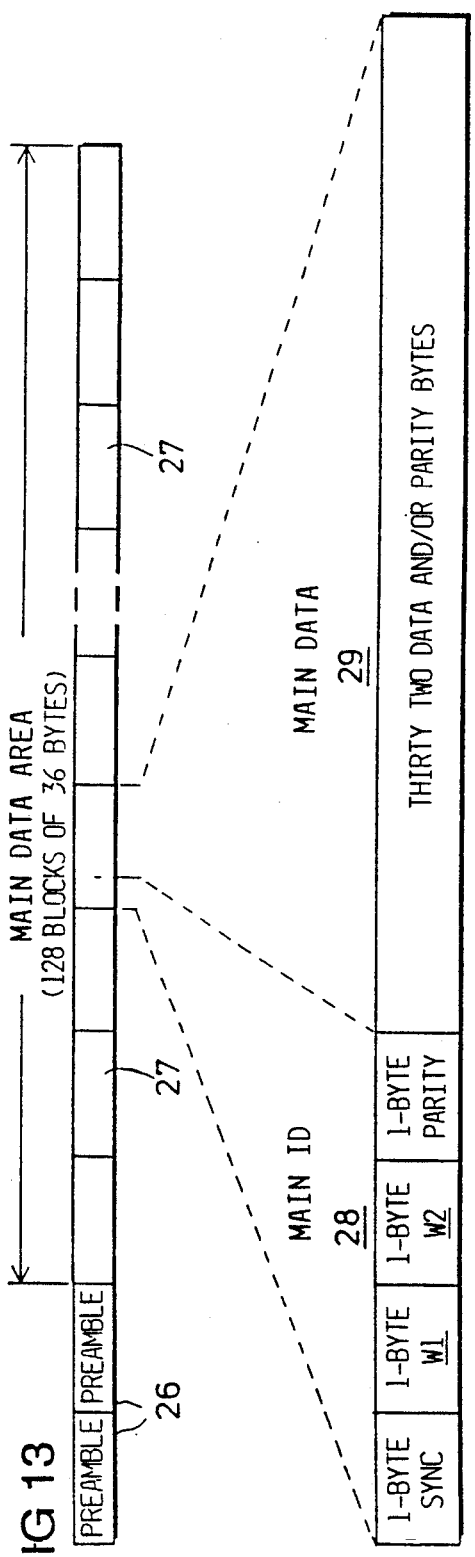
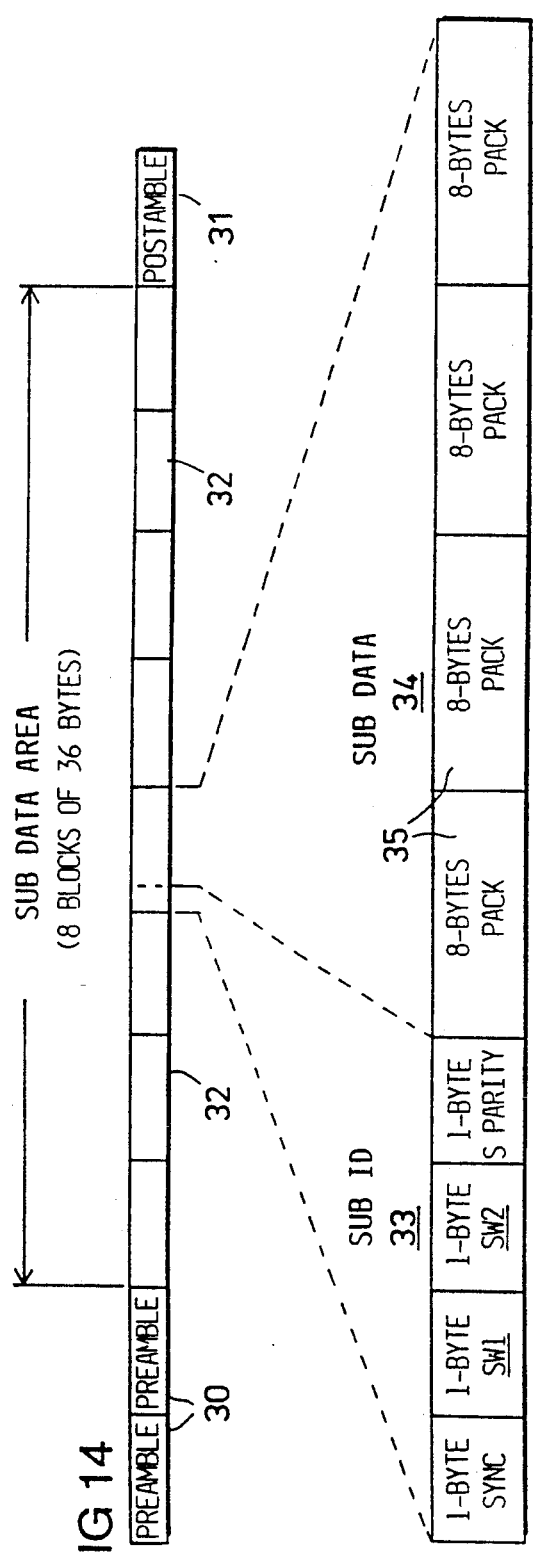

| INPUT | OUTPUT | COMMENT |
|-------|--------|---------|
| R | R | INNOVATION |
| I | I | INNOVATION |
| N | N | INNOVATION |
| T | T | INNOVATION |
| INT | < 3,3 > | OFFSET 3, LENGTH 3 |
| IN | < 3,2 > | OFFSET 3, LENGTH 2 |

DATA COMPRESSION METHOD AND APPARATUS UTILIZING AN ADAPTIVE DICTIONARY

FIELD OF THE INVENTION

The present invention relates to a method of compressing user data for storage on tape in a way which improves access to the compressed data.

BACKGROUND OF THE INVENTION

It is known to provide a tape drive having data compression capability (a DC drive) so that, as data arrives from a host, it is compressed before being written to tape thus increasing the tape storage capacity. DC drives are also able to read compressed data from tape and to decompress the data before sending it to a host. It is also possible for a host to perform software compression and/or decompression of user data.

There is more than one type of data compression. For example, removing separation marks (e.g. designating records, files etc.) from the datastream and storing information regarding the positions of these marks in an index effectively compresses the user data. Another, quite different approach, is to compress user data by removing redundancy in the data (e.g. by replacing user data words with codewords or symbols from which the original data can be recovered). It is the latter type which is being referred to in this specification when the words "data compression" or abbreviation DC is used.

Several different algorithms are known for compressing data. One approach is to convert the user data to code words using a dictionary which is created dynamically as the data is compressed. The dictionary is recreated, again dynamically, during decompression. An algorithm which adopts this approach is the LEMPEL ZIV WELCH algorithm or the LZW algorithm.

During data compression, a DC drive operating according to the Lempel Ziv Welch (LZW) algorithm inserts a RESET codeword into the datastream indicative of when a new dictionary is started. A FLUSH codeword is inserted when data is to be flushed (i.e. the small amount of data held in a buffer awaiting compression is passed through before further incoming data is sent to the buffer).

Using the LZW algorithm, to achieve decompression of part of the compressed data on a tape, it is necessary to begin decompressing from a RESET code word in order to be able to recreate the relevant dictionary. Normally, a FLUSH operation is performed prior to beginning a new dictionary so that the new dictionary can start at a convenient point in the data (e.g. at the beginning of the record).

Another approach to data compression is to reference a chosen amount of the most recent uncompressed datastream (termed a 'history buffer' or 'sliding window' or 'sliding dictionary') and to replace items in the incoming datastream which appear in the history buffer with codewords/tokens indicating where in the history buffer they are located. This approach is known as the first Lempel Ziv algorithm or LZ1. During decompression, a history buffer is also referenced and as codewords/tokens are encountered the relevant strings from the history buffer are replaced to reconstruct the original datastream.

In this approach, a RESET command has the effect of clearing the history buffer and a FLUSH command has the effect of clearing the lookahead buffer.

A flush operation can therefore generally be thought of as passing through a relatively small amount of raw data or completing a compression operation on data which is awaiting compression before recommencing data compression at a convenient point in the data stream. It is applicable whether compression is being performed by software or hardware.

SUMMARY OF THE PRESENT INVENTION

The present invention provides a method for compressing user data and for storing the user data on magnetic tape. The user data is accepted and organized into a plurality of records. The user data is then compressed according to a compression algorithm involving converting at least some of the user data to codewords using a dictionary which is derived from the data. Specific codewords are inserted into the compressed data to indicate when the data is flushed from a memory and when a new dictionary is created.

In this specification, the term 'codeword' is used extensively in connection with the LZW algorithm. Generally, the term is intended to cover any symbol or token or other representation which is used to replace portions of user data during data compression. The term 'dictionary' is intended to cover a collection of byte strings and corresponding codewords for use in converting compressed data into uncompressed data. In both of the previously mentioned data compression algorithms, the dictionary is generated during data compression and is contained in the compressed data itself.

An advantage of the present invention is that a segment of data which is smaller than the amount used to build up a dictionary can selectively be recovered from the tape in its compressed form. In other words, the FLUSH code words within a dictionary provide a "clean break" between segments of data which were used to compile or which used that dictionary. For example, a FLUSH code word may be inserted in the datastream at the end of each record.

Preferably, the method comprises storing on tape indications of the locations at which the flush operations occurred in a manner enabling these to be distinguished from the user data.

One way of implementing this feature is to store the compressed byte count (CBC) for each record or other data segment defined between a pair of FLUSH operations.

Preferably, the method comprises storing on tape indications of the locations of the beginning of new dictionaries in a manner enabling these to be distinguished from the user data.

One way of implementing this feature is to store on tape information about the particular compression algorithm being used at the start of each new dictionary.

In a preferred embodiment, the method comprises writing the compressed user data to tape in groups independent of the record organization and beginning a new dictionary at or near the beginning of each group. Preferably, the method comprises beginning a new dictionary at the beginning of the first new record in each group.

This feature is advantageous in that it helps reduce the amount of buffer space required in the device controller by reducing the linkage between groups of data (i.e. it makes it less likely for it to be necessary to store more than one group in the buffer). Furthermore, it is advantageous not to have to look outside a particular group in order to decompress a data segment in that group.

In a further embodiment, the method comprises organizing records into entities, where an entity comprises one or more records, and carrying out flush operations at the end of each entity. This feature enables data to selectively be decompressed on a per entity basis. Preferably, a new dictionary is started at the beginning of the first new entity in each group, for the reasons mentioned above.

The present invention further provides a storage device for compressing user data and storing compressed user data on tape which operates in accordance with a method as previously defined.

BRIEF DESCRIPTION OF THE DRAWINGS

Particular embodiments of the present invention will now be described, by way of example, with reference to the accompanying drawings in which:

FIG. 1(a) through (c) illustrates various schemes for storing computer data:

FIG. 3 and 3A are diagrams of general block access tables;

FIG. 4 and 4A are diagrams of specific block access tables;

FIG. 13 is a diagrammatic representation of the format of a main data area of a data track recorded in accordance with the present data storage method;

FIG. 14 is a diagrammatic representation of the format of a sub data area of a data track recorded in accordance with the present data storage method;

DETAILED DESCRIPTION OF THE INVENTION

Figure 2:
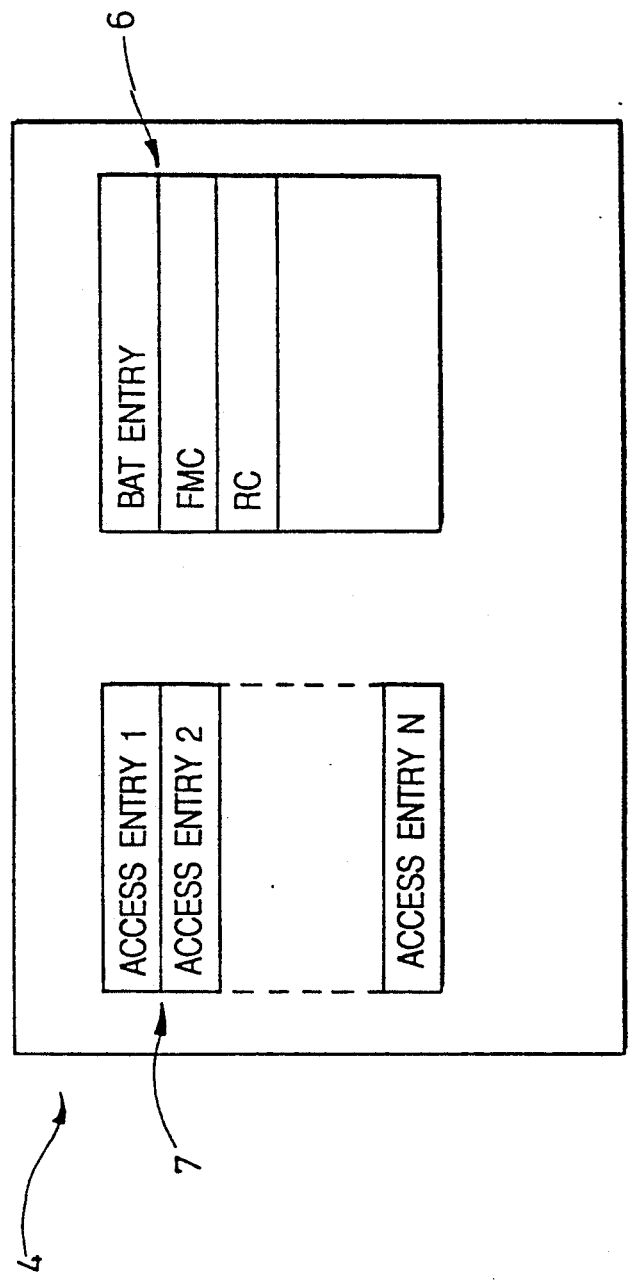
FIG. 2 is a block diagram of a group index.

Further information regarding data compression, including details of a specific DC algorithms will first be given.

The aim of a data compression process is to remove redundancy from data. One measure of compression efficiency is called "compression ratio" and is defined as:

$$\frac{\text{Length of uncompressed input}}{\text{Length of compressed output}}$$

This is a measure of the success of a data compression process. The larger the compression ratio, the greater the compression efficiency.

One way of performing data compression is by recognizing and encoding patterns of input characters, i.e. a substitutional method.

According to the LZW algorithm, as unique strings of input characters are found, they are entered into a dictionary and assigned numeric values. The dictionary is formed dynamically as the data is being compressed and is reconstructed from the data during decompression. Once a dictionary entry exists, subsequent occurrences of that entry within the datastream can be replaced by the numeric value or codeword. It should be noted that this algorithm is not limited to compressing ASCII text data. Its principles apply equally well to binary files, data bases, imaging data, and so on.

Each dictionary entry consists of two items: (1) a unique string of data bytes that the algorithm has found within the data, and (2) a codeword that represents this combination of bytes. The dictionary can contain up to 4096 entries. The first eight entries are reserved codewords that are used to flag and control specific conditions. The next 256 entries contain the byte values 0 through 255. Some of these 256 entries are therefore codewords for the ASCII text characters. The remaining locations are linked-list entries that point to other dictionary locations and eventually terminate by pointing at one of the byte values 0 through 255. Using this linked-list data structure, the possible byte combinations can be anywhere from 2 bytes to 128 bytes long without requiring an excessively wide memory array to store them.

In a hardware implementation of the scheme which will be more fully described later, the dictionary is built and stored in a bank of random-access memory (RAM) that is 23 bits wide. Each memory address can contain a byte value in the lower 8 bits, a codeword or pointer representing an entry in the next 12 bits, and three condition flags in the upper 3 bits. The number of bits in the output byte stream used to represent a codeword ranges from 9 bits to 12 bits and corresponds to dictionary entries that range from 0 to 4095. During the dictionary building phase, until 512 entries are made into the dictionary 9-bits are used for each codeword, after the 512th entry 10-bits are needed for the codewords, after the 1024th entry 11-bits are needed for the codewords, and for the final 2048 entries 12-bits are needed for the codewords. Once the dictionary is full, no further entries are built, and all subsequent codewords are 12 bits in length. The memory address for a given dictionary entry is determined by a complex operation performed on the entry value. Since the dictionary can contain 4096 entries, it would appear that 4K bytes of RAM is all that is needed to support a full dictionary. This is in fact the case during decompression. However, during compression, more than 4K bytes of RAM is needed because of dictionary "collisions" that occur during the dictionary building phase. This is when two different string character combinations map to the same location in the dictionary RAM and is a consequence of the finite resources in dictionary RAM and the complex process of dictionary building during compression. When a dictionary collision occurs, the two colliding values are recalculated to two new locations and the original location is flagged as a collision site.

An important property of the algorithm is the coupling between compression and decompression. These two operations are tied together both in the compression and decompression processes and in the packing and unpacking of codewords into a byte stream. The nature of the compression algorithm requires that the compression process and the decompression process be synchronized. Stated differently, decompression cannot begin at an arbitrary point in the compressed data. It begins at the point where the dictionary is known to be empty or reset. This coupling provides one of the fundamental advantages of the algorithm, namely that the dictionary is embedded in the codewords and does not need to be transferred with the compressed data. Similarly, the packing and unpacking process must be synchronized. Note that compressed data must be presented to the decompression hardware in, the proper order.

Figure 21:
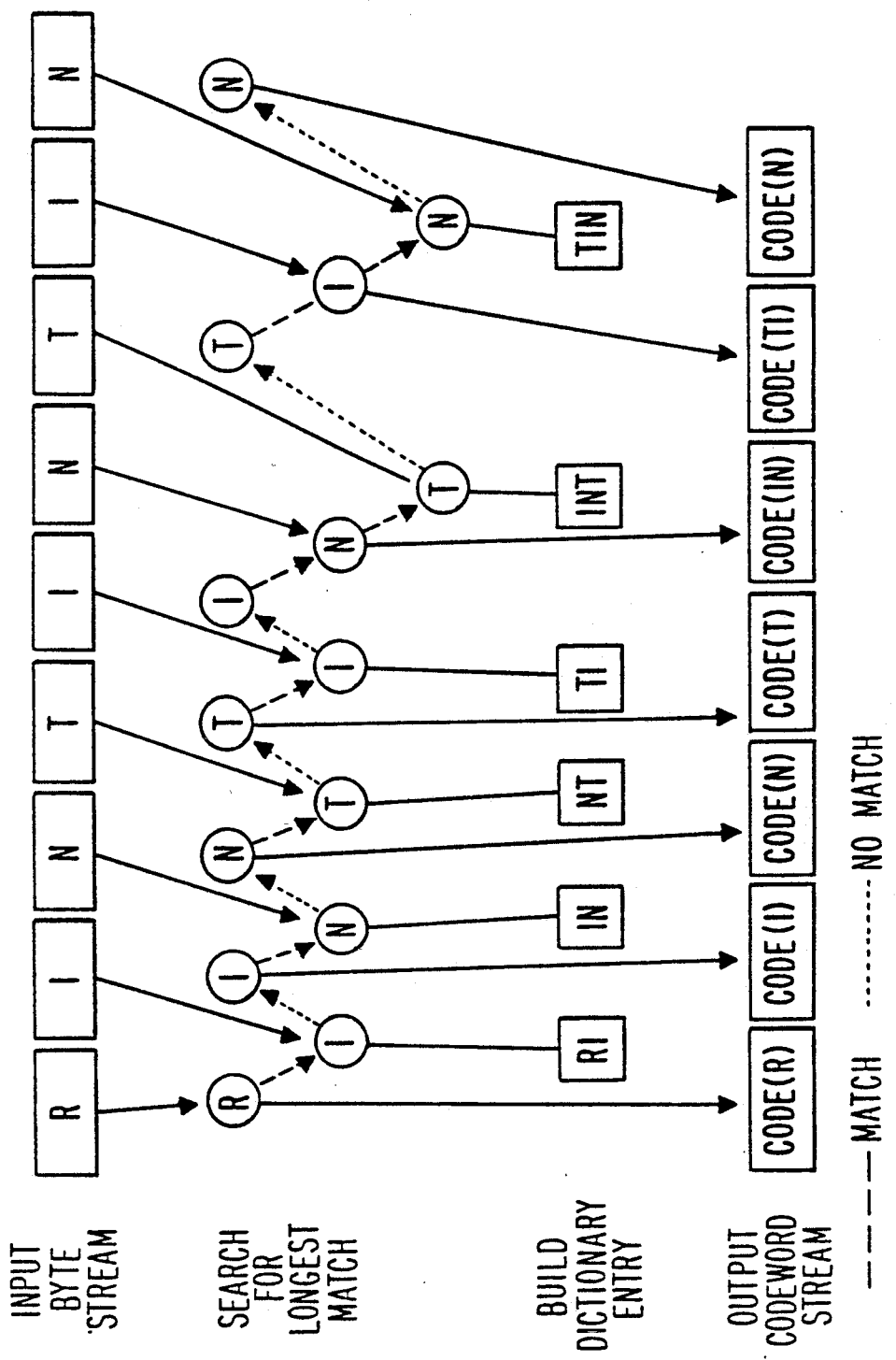
FIGS. 21 and 22 are data flow diagrams in accordance with the LZW data compression algorithm.

FIG. 21 is a simplified graphical depiction of the compression algorithm referred to above. This example shows an input data stream composed of the following characters: R I N T I N T I N. To follow the flow of the compression process, FIG. A should be viewed from the top to the bottom, starting at the left and proceeding to the right. It is assumed that the dictionary has been reset and initialized to contain the eight reserved codewords and the first 256 entries of 0 to 255 including codewords for all the ASCII characters.

The compression algorithm executes the following process with each byte in the data stream:
1. Get the input byte.
2. Search the dictionary with the current input sequence and, if there is a match, get another input byte and add it to the current sequence, remembering the largest sequence that matched.
3. Repeat step 2 until no match is found.
4. Build a new dictionary entry of the current "no match" sequence.
5. Output the codeword for the largest sequence that matched.

In this example, the compression algorithm begins after the first R has been accepted by the compression engine. The input character R matches the character R that was placed in the dictionary during its initialization. Since there was a match, the DC engine accepts another byte, this one being the character I. The sequence RI is now searched for in the dictionary but no match is found. Consequently, a new dictionary entry RI is built and the codeword for the largest matching sequence (i.e., the codeword for the character R) is output. The engine now searches for I in the dictionary and finds a match just as it did with R. Another character is input (N) and a search begins for the sequence IN. Since IN does not match any entries, a new one is built and the codeword for the largest matching sequence (i.e., the codeword for the character I) is output. This process continues with a search for the letter N. After N is found, the next character is input and the dictionary is searched for NT. Since this is not found, a dictionary entry for NT is built and the codeword for N is output. The same sequence occurs for the characters T and I. A codeword for T is output and a dictionary entry is built for TI.

Up to this point, no compression has occurred, since there have been no multiple character matches. In actuality, the output stream has expanded slightly, since four 8-bit characters have been replaced by four 9-bit codewords. (That represents a 32-bit to 36-bit expansion, or a 1:1.125 compression ratio.) However, after the next character has been input, compression of the data begins. At this point, the engine is searching for the IN sequence. Since it finds a match, it accepts another character and begins searching for INT. When it does not find a match, it builds a dictionary entry for INT and outputs the previously generated codeword for the sequence IN. Two 8-bit characters have now been replaced by one 9-bit codeword for a compression ratio of 16/9 or 1.778:1.

This process continues and again two characters are replaced with a single codeword. The engine begins with a T from the previous sequence and then accepts the next character which is an I. It searches for the TI sequence and finds a match, so another byte is input. Now the chip is searching for the TIN sequence. No match is found, so a TIN entry is built and the codeword for TI is output. This sequence also exhibits the 1.778:1 compression ratio that the IN sequence exhibited. The net compression ratio for this string of 9 bytes is 1.143:1. This is not a particularly large compression ratio because the example consists of a very small number of bytes. With a larger sample of data, more sequences of data are stored and larger sequences of bytes are replaced by a single codeword. It is possible to achieve compression ratios that range from 1:1 up to 110:1.

Figure 22:
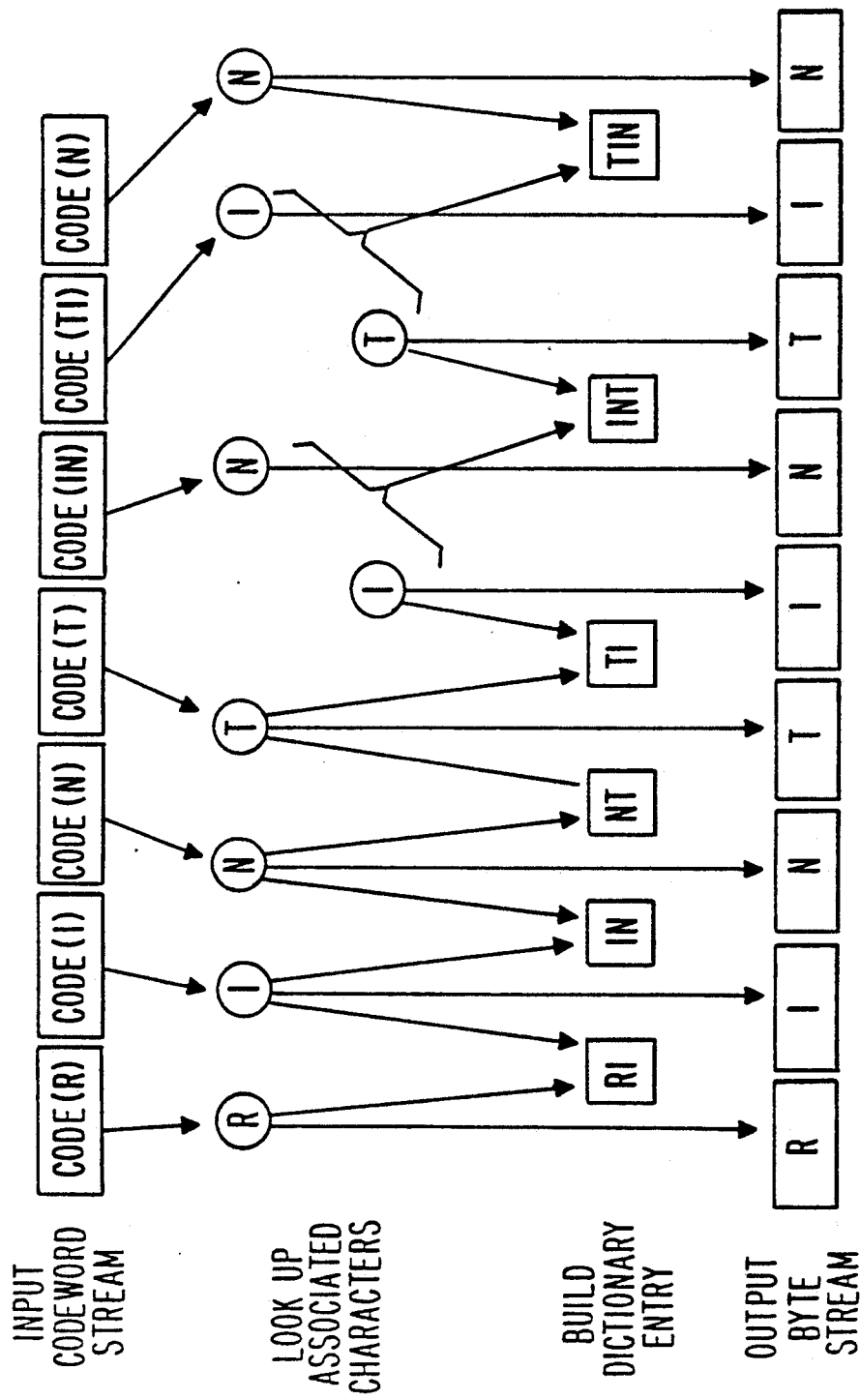

A simplified diagram of the decompression process is shown in FIG. 22. This example uses the output of the previous compression example as input. The decompression process looks very similar to the compression process, but the algorithm for decompression is less complicated than that for compression, since it does not have to search for the presence of a given dictionary entry. The coupling of the two processes guarantees the existence of the appropriate dictionary entries during decompression. The algorithm simply uses the input codewords to look up the byte sequence in the dictionary and then builds new entries using the same rules that the compression algorithm uses. In this way the decompression algorithm can recover the compressed data without a special dictionary being sent with the data packets.

As in the compression example, it is assumed that the dictionary has been reset and initialized to contain the first 256 entries of 0 to 255. The decompression engine begins by accepting the codeword for R. It uses this codeword to look up the byte value R. This value is placed on the last-in, first-out (LIFO) stack, waiting to be output from the chip. Since the R is one of the root codewords (one of the first 256 entries), the end of the list has been reached for this codeword The output stack is then dumped from the chip. The engine then inputs the codeword for I and uses it to look up the byte value I. Again, this value is a root codeword, so the output sequence for this codeword is completed and the byte value for I is popped from the output stack. At this point, a new dictionary entry is built using the last byte value that was pushed onto the output stack (I) and the previous codeword (the codeword for R). Each entry is built in this manner and contains a byte value and a pointer to the next byte in the sequence (the previous codeword). A linked list is generated in this manner for each dictionary entry.

The next codeword is input (the codeword for N) and the process is repeated. This time an N is output and a new dictionary entry is built containing the byte value N and the codeword for I. The codeword for T is input, causing a T to be output and another dictionary entry to be built. The next codeword that is input represents the byte sequence IN. The decompression engine uses this codeword to reference the second dictionary entry, which was generated earlier in this example. This entry contains the byte value N, which is placed on the output stack, and the pointer to the codeword for I, which becomes the current codeword. This new codeword is used to find the next byte (I), which is placed on the output stack. Since this is a root codeword, the look up process is complete and the output stack is dumped in reverse order, that is, I is output first, followed by N. The same process is repeated with the next two codewords, resulting in the recovery of the original byte sequence R I N T I N T I N.

Two of the reserved codewords mentioned above which are inserted into the datastream during data compression are codewords for RESET and FLUSH conditions. The RESET codeword signifies the start of a new dictionary. The FLUSH codeword signifies that the DC chip has flushed out its buffer i.e. it outputs codewords for the data currently held in the buffer (which represents the current longest match) prior to filling the buffer again with successive data. The DC chip inserts RESET and FLUSH codewords into the data stream in an algorithm-dependent manner. However, the tape format places constraints on when certain RESET and FLUSH codewords must occur and also ensures the writing of certain information so as to enable the utilization of certain ones of the RESET and FLUSH codewords in order to improve access to the compressed data.

Since the codewords output by an LZW algorithm processor can be other than 8 or 16 bits each, a "packer" is usually included in the system, accepting codewords and outputting bytes of packed codewords. This packing process necessarily withholds partial bytes from its output, waiting for the next codeword to be produced by the compression algorithm. This partial codeword represents additional data that has been taken into the compression system, but is not yet reflected in its output.

At some point, the system embodying the compression engine will require that all the bytes going into the compressor have been represented in its output. This means that the compressor must be told that the current match is the longest one it will find, and it should therefore output its current matching codeword. It also means that any partial codewords are output from the compression system. This is the FLUSH operation where the compressor is "flushed" when every byte it has received has been represented in its output. It is withholding no data from its output.

Decompression can only begin from a RESET codeword because the dictionary has to be rebuilt from the data. However, decompression can then stop at any subsequent FLUSH codeword even though this is not at the end of that particular dictionary. This is why it is advantageous to put FLUSH codewords at the end of each record so as to enable selective decompression of segments of data which are smaller than that used to build a dictionary.

Decompression systems comprise an unpacking section providing codewords to a decompressor. While the decompressor does not have the task of finding longest matches and does not therefore involve any intrinsic buffering, the unpacker can only take data from the outside world a byte at a time, and therefore will typically be withholding partial codewords from the decompressor.

Once the final codeword preceding the "flushed" condition during compression has been supplied to the decompressor, the unpacker must discard any of the bits left over. These bits are not part of the next codeword, but are rather padding introduced by the flush operation during compression. Therefore, the unpacker must know where these flushes occurred during compression.

At the beginning of a dictionary, the majority of the data is passed through the DC chip without compression because most of the data will not have previously been seen. At this stage, the compression ratio is relatively small. Therefore, it is not desirable to have to restart a dictionary so often as to reduce compression efficiency.

If the compression ratio is high despite the current dictionary being full, the dictionary may be maintained in its static state i.e. no more entries can be added until the compression ratio falls and it is more efficient to start a new dictionary.

According to the LZ1 algorithm the basic idea is to substitute a common string of text with a special symbol. This symbol tells the decompressor that the string was transmitted or stored earlier and that the decompressor need only substitute the previous occurrence for the special symbol. More formally, the output of the compressor is obtained by alternating references to previous occurrences of strings, called citations, with uncompressed characters, called innovations. Innovations are characters which appear unchanged in the compressed output, and they are included in order to allow the decompressor to recognize the use of new, previously unseen characters.

The algorithm requires a buffer (known as the 'window') and split into two parts. The majority of the buffer contains the past history of the input; this is the characters which have already been compressed. A small portion at the end of the window is called the lookahead buffer and contains the future characters to compress. To use this structure, the lookahead buffer is compared to the rest of the window.

Figures 23, 24:
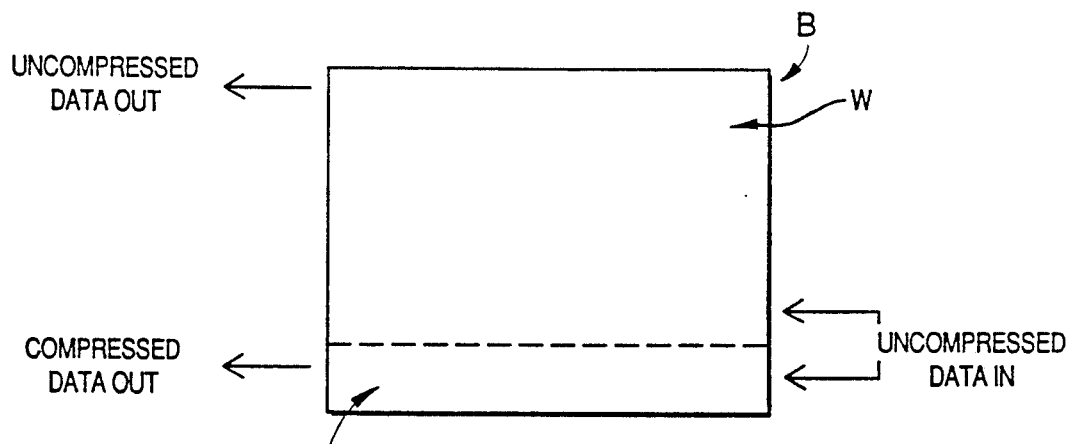
FIG. 23 is a diagrammatic representation of a buffer used according to the LZ1 algorithm.
FIG. 24 is a table exemplifying data compressed according to the LZ1 algorithm.

Referring to FIG. 23, a buffer B is indicated which is divided into a window buffer W and a lookahead buffer L. Incoming data to be compressed is stored in the lookahead buffer L which has a capacity of several characters e.g. 20 characters. The window buffer W contains a history of most recent past data and has a capacity of a few thousand characters e.g. 4096 characters. Raw data enters the window buffer W from the lookahead buffer L and the oldest data in the window buffer W is discarded (once the window buffer W is full). For this reason the window buffer W is sometimes termed a 'sliding window'.

According to one implementation of the LZ1 algorithm, as data goes into the lookahead buffer L, each character is compared with the contents of the window buffer W. If no match is found for a character, that character is output in its raw state i.e. as an innovation. That character then also enters the window buffer W.

Once a match is found for a character in the lookahead buffer L, the next character is also considered in combination with the matched character to see whether a longer match can be found. This process is repeated until adding a further character means that there is no longer a match in the window buffer W. A codeword/symbol which indicates the length of the match and its position in the window buffer W is then output and the relevant string is added to the window buffer W.

A codeword/symbol is allowed to refer to a string extending into the lookahead buffer as long as the first character of the reference occurs prior to the buffer. When the match extends into the lookahead buffer, the LZ1 compressor is performing a kind of run-length encoding. If the match begins at the character before the buffer, then the compressor is compressing a run such as "aaaaaa...". Similarly, if the first character of a match begins several characters before the buffer, then the compressor is compressing a run such as "ababab..." or "abcabcabc...".

The RINTINTIN example is compressed according to this approach as shown in FIG. 24, assuming that this is the first piece of data to be compressed i.e. that the window buffer B is empty to start with. The first four characters are output as innovations. The fifth character, I, is in the window buffer W so the next character N is considered to check whether IN is already in the window buffer W. It is, so the string INT is considered—that is also in the window buffer. However, adding the next character I, produces a string, INTI, which is not in the window buffer W. Therefore a codeword is output indicating the position of INT in the window buffer W and that it is of length 3. The position is indicated by an 'offset' i.e. how far back from the current character does the match start in the window buffer W.

The next character, I, matches with the previous I in the window buffer and the final string, IN, matches the instance of that string 3 characters back in the window buffer, hence an output codeword <3,2>.

During decompression, a window buffer is also kept and when a codeword is found in the incoming data to be decompressed, decompression involves looking up the appropriate string in the window buffer according to its offset and length and outputting the string. Therefore, in RINTINTIN example, when the first codeword, <3,3>, is encountered, a string of length 3 which begins 3 characters back i.e. INT is output. When the next codeword, <3,2>, is encountered, a string of length 2 which begins 3 characters back i.e IN is output.

According to the LZ1 approach, a RESET command has the effect of clearing the window buffer. A FLUSH command has the effect of clearing the lookahead buffer. Accordingly, a 'dictionary' in the LZ1 approach is represented by the amount of data which has 'slid' through the window buffer in between two consecutive RESET commands. As with the LZW algorithm, decompression must commence from the last RESET.

There is an advantage in sharing a dictionary over a plurality of records i.e. not resetting the window buffer at the end of each record, in that it enables the compression ratio to be improved for sequences of relatively short records.

The effect of a FLUSH command is to cause the entire contents of the lookahead buffer to be matched as previously described and output before any more data is allowed into the lookahead buffer. An advantage of flushing the lookahead buffer in this way in between consecutive RESET commands is that it permits selective decompression of segments of data which are smaller than that used to make up a dictionary. This is particularly useful when it is desired to append data records to compressed data stored on tape. If the lookahead buffer is flushed after each data record, it will be possible to find the end of any compressed record on tape so that further records can be appended clearly after the end of the existing records.

It will be appreciated that FIG. 23 is purely schematic for the purposes of explanation. The window buffer may be implemented in the form of two pointers defining a segment of past data or indeed any other suitable arrangements may be used.

Methods for the storage of data, whether compressed or uncompressed, on tape will now be described.

The supply of the data from a user (host computer) to a tape storage apparatus will generally be accompanied by user separation of the data, whether this separation is the physical separation of the data into discrete packages (records) passed to the storage apparatus, or some higher level conceptual organization of the records which is expressed to the storage apparatus by the host in terms of specific signals. This user-separation of data will have some particular significance to the host (though this significance will generally be unknown to the tape storage device). It is therefore appropriate to consider user separation as a logical segmentation even though its presence may be expressed to the storage apparatus through the physical separation of the incoming data.

FIG. 1(a) illustrates a sequence of user data and special separation signals that an existing type of host might supply to a tape storage apparatus. In this example, data is supplied in variable-length records R1 to R9; the logical significance of this physical separation is known to the host but not to the storage apparatus. In addition to the physical separation, user separation information is supplied in the form of special "file mark" signals FM. The file marks FM are provided to the storage apparatus between data records; again, the significance of this separation is unknown to the storage apparatus. The physical separation into records provides a first level of separation while the file marks provide a second level forming a hierarchy with the first level.

FIG. 1(b) shows one possible physical organization for storing the user data and user separation information of FIG. 1(a) on a tape 10, this organization being in accordance with a known data storage method. The mapping between FIG. 1(a) and 1(b) is straightforward—file marks FM are recorded as fixed-frequency bursts 1 but are otherwise treated as data records, with the records R1–R9 and the file marks FM being separated from each other by inter-block gaps 2 where no signal is recorded. The interblock gaps 2 effectively serve as first-level separation marks enabling the separation of the stored data into the user-understood logical unit of a record; the file marks FM (fixed frequency burst 1) form second-level separation marks dividing the records into logical collections of records.

FIG. 1(c) shows a second possible organization which is known for storing the user data and user separation information of FIG. 1(a) on tape 10. In this case, the user data is organized into fixed-size groups 3 each including an index 4 for containing information about the contents of the group. The boundary between two groups 3 may be indicated by a fixed frequency burst 5. The division of data into groups is purely for the convenience of the storage apparatus concerned and should be transparent to the host. The user data within a group is not physically separated in any way and each record simply continues straight on from the end of the preceding one; all information regarding separation of the data in a group both into records and into the collection of records delimited by file marks is contained in the index of the group. In the present example, records R1 to R8 and the first part of R9 are held in the illustrated group 3.

The length of the index 4 will generally vary according to the number of separation marks present and the number of records in the group; however, by recording the index length in a predetermined location in the index with respect to the group ends, the boundary between the index and the last byte can be identified. A space with undefined contents, e.g. padding, may exist between the end of the data area and the first byte of the index.

The contents of the index 4 are shown in FIG. 2 and, as can be seen, the index comprises two main data structures, namely a group information table 6 and a block access table 7. The number of entries in the block access table 7 is stored in a block access table entry (BAT ENTRY) count field in the group information table 6. The group information table 6 also contains various counts, such as a file mark count FMC (the number of file marks written since a beginning of recording (BOR) mark including any contained in the current group) and record counts RC (to be defined).

The block access table 7 describes by way of a series of access entries, the contents of a group and, in particular, the logical segmentation of the user data held in the group (that is, it holds entries indicative of each record boundary and separator mark in the group). The access entries proceed in order of the contents of the group.

Referring to FIG. 3, the entries in the block access table each comprise a FLAG entry indicating the type of the entry and a COUNT entry indicating its value. The FLAG field is 8 bits and the COUNT field is 24 bits. The bits in the FLAG field have the following significance:

SKP—A SKIP bit which, when set, indicates a "skip entry". A skip entry gives the number of bytes in the group which is not taken up by user data i.e. the size of the group minus the size of the user data area.

XFR—A DATA TRANSFER bit which, when set, indicates the writing to tape of user data.

EOX—An END OF DATA TRANSFER bit which, when set, indicates the end of writing a user data record to tape.

CMP—A COMPRESSION bit which, when set, indicates that the entry relates to compressed data.

EOT—The value of this bit does not matter for the purposes of this description.

MRK—A SEPARATOR MARK bit which, when set, indicates that the entry relates to a separator mark rather than to a data record.

BOR—A BEGINNING OF RECORD bit which, when set, indicates the location of the beginning of a data record.

EOR—An END OF RECORD bit which, when set, indicates the location of the end of a data record on tape.

FIG. 3 illustrates the seven types of entry which can be made in the block access table. The SEPARATOR MARK entry has the BOR and EOR bit set because it is treated by the drive as a record. The next four entries each have the XFR bit set because they represent information about data transfers. The START PART OF RECORD entry relates to a case where only the beginning of a record fits into the group and the next part of the record runs over to the following group. The only bit set in the MIDDLE PART OF RECORD entry flag is the data transfer bit because there will not be a beginning or end of a record in that group. The END PART OF RECORD entry does not have the EOR bit set in the FLAG—instead, the EOR bit is set in the TOTAL COUNT entry which gives the total record byte count. The last entry in the block access table for a group is always a SKIP entry which gives the amount of space in the group which is not taken up by user data i.e. the entry in the Count field for the SKIP entry equals the group size (e.g. 126632 bytes) minus the data area size.

An example of a block access table for the group 3 of records shown in FIG. 1(c) is shown in FIG. 4. The count entries for records R1-8 are the full byte counts for those records whereas the count entry for record R9 is the byte count of the part of R9 which is in the group 3. The count entries for the file marks FM will be 0 or 1 according to the format. The count entry for the SKIP entry is 126632 minus the sum of the byte counts appearing previously in the table (not including Total Count entries).

In another embodiment there is a further possible entry in the block access table which signifies the algorithm used to compress the data in the group as shown in FIG. 3A. The algorithm number which is entered in the COUNT field is preferably one which conforms to a standard for DC algorithm numbers. The data transfer and total count FLAG entries for compressed records in the group have the CMP bit set. Thus compressed and uncompressed records in a group can be distinguished by a drive on the basis of the CMP bit. For example, if we suppose that in FIG. 1(c), the even-numbered records are compressed records and the odd-numbered records are uncompressed, the block access table entries would be as shown in FIG. 4A. In FIG. 4A, UBCX indicates an uncompressed byte count for record X and CBCX indicates a compressed byte count for record X.

Figure 5:
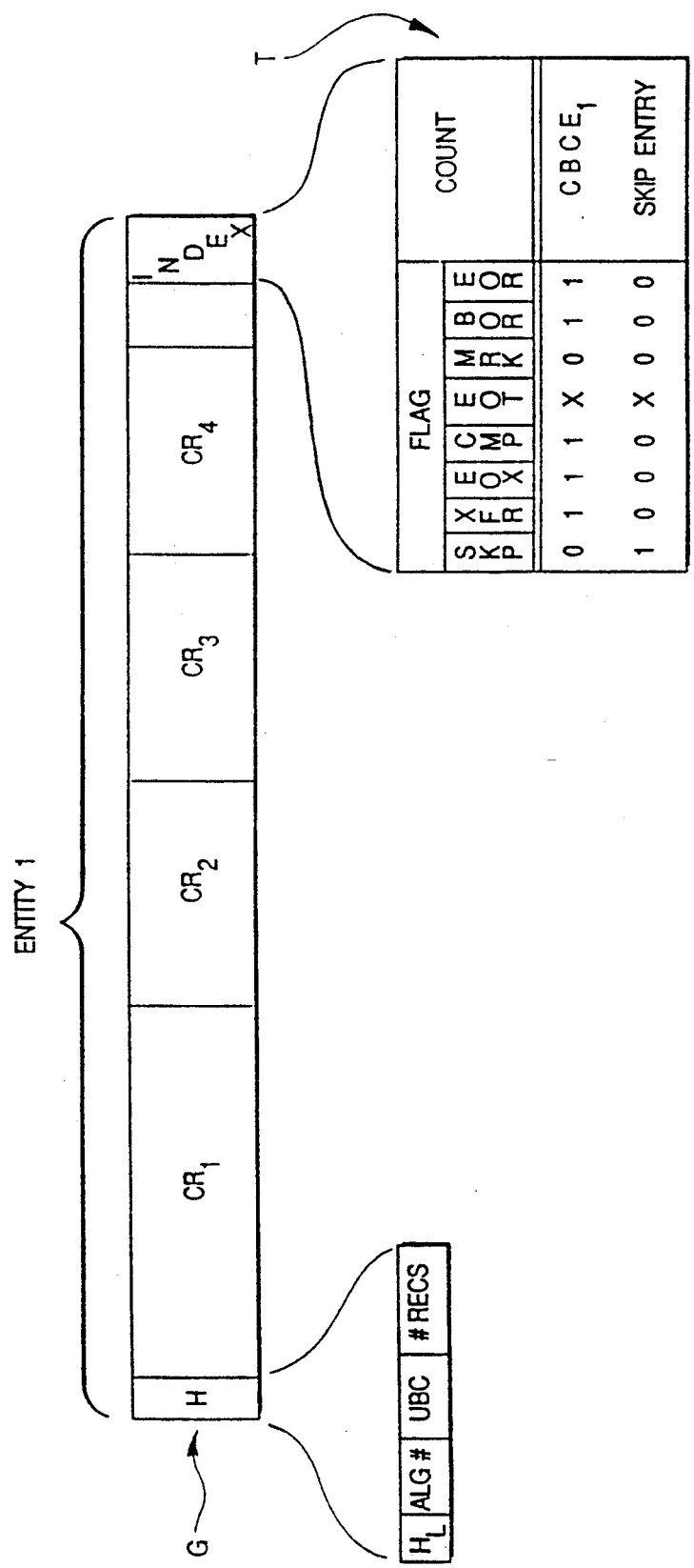
FIGS. 5A, 6 and 7 are diagrams of alternative schemes for storing computer data according to the present invention.

FIG. 5 shows another possible organization for storing user data and related information on tape. Again, the user data is organized into fixed size groups each group including an index which is uncompressed even if the group contains compressed data comprising a block access table for containing information about the contents of the group. The boundaries between groups may be indicated by fixed frequency bursts.

However, rather than storing information in the group index solely in terms of records, this embodiment involves storing the information about the contents of the group in terms of "Entities", where an entity comprises one or more records. In this embodiment, an entity can contain n compressed records each having the same uncompressed length, where n is equal to or greater than 1.

In FIG. 5, a group G comprises a single entity ENTITY 1 (or $E_1$) which comprises four complete records CR CR$_4$ of compressed data and a header portion H of 8 bytes. The records CR$_1$–CR$_4$ have the same uncompressed length but may well be of different length after undergoing data compression.

The header portion H, which remains uncompressed, in the datastream contains the following information:

H$_L$—The header length (4 bits). (The next 12 bits are reserved).

ALG#—A recognized number denoting the compression algorithm being used to compress data (1 byte).

UBC—The uncompressed byte count for the records in the entity (2 bytes).

RECS—The number of records in the entity (3 bytes).

Optionally, an entity may include trailer portions at the end of each of the records in the entity, the trailer portions containing the compressed byte count of each record. Thus the trailer would occur immediately after an "end of record" (EOR) codeword. If this feature is present, the length of the trailer e.g. 3 bytes, could also be indicated in the header portion, in the 12 bits reserved after the header length H$_L$.

Figure 5A:
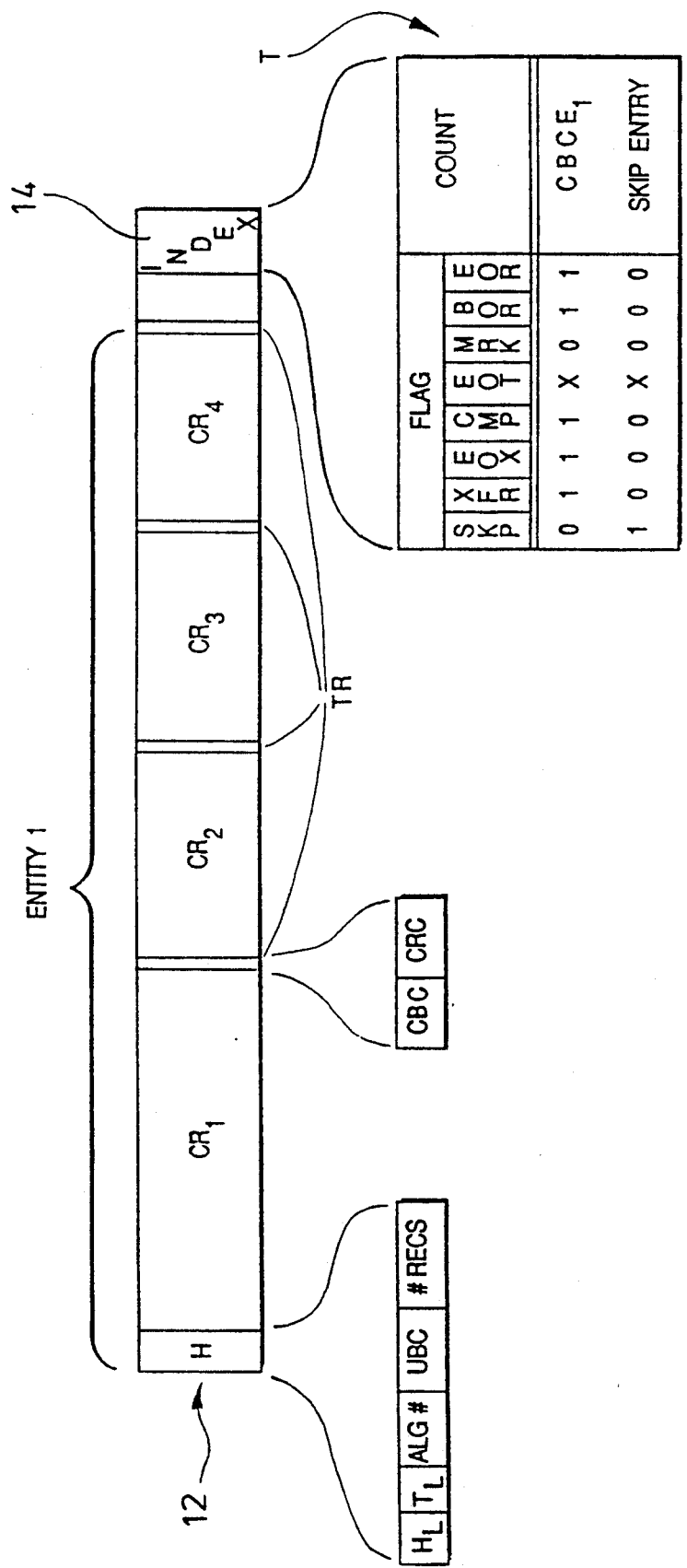

An example of an embodiment in which each record in an entity has a trailer portion is shown in FIG. 5A. The trailer portion is inserted into the datastream, uncompressed, at the end of each compressed record. Thus the entity in FIG. 5A comprises a header portion H and four compressed records CR$_1$–CR$_4$ of equal length when uncompressed, each of which has an uncompressed trailer portion T.

The trailer portion TR of each record contains the compressed byte count (CBC) of the record and a cyclic redundancy check (CRC). The trailer occupies 6 bits at the end of each record in this example. The length (T$_L$) of the trailer is included in the header portion H and occupies the last four bits of the first byte of the header portion H.

The inclusion of trailer portions does not alter the nature of the entries in the block access table T although the SKIP count entry will accordingly be smaller.

Insertion of compressed byte counts in the datastream has the advantage that a DC drive or a suitably configured non-DC drive can use these as pointers in a linked list to deduce where each compressed record begins and ends.

An advantage of including the length of the header portion (and the trailer portion if appropriate) in the header is that it enables this length to be varied while still allowing a drive to skip over the header if desired.

Information is recorded in a block access table T in the index of each group in terms of entities rather than in terms of records but otherwise as previously described with reference to FIGS. 2 through 4. The entries in the block access table for the entity E$_1$, are also shown in FIG. 5.

The types of entries which are made in the block access table T are similar to those described with reference to FIG. 2 through 4. The difference is that, now setting of the CMP bit in the FLAG field indicates that the entry relates to a byte count for an entity rather than for a record.

One possibility is to allow entities to contain only compressed records and this is preferred. Then setting of the CMP bit in the FLAG field still indicates that the COUNT entry is a compressed byte count. However, another possibility is to allow entities to contain either compressed data or uncompressed data and to reserve a particular algorithm number (e.g. all zeros), to indicate that the data in an entity is uncompressed.

Storing information in the block access table T in terms of entities rather than records reduces the storage management overhead associated with writing and reading the records to and from tape. Whereas, using the scheme shown in FIGS. 2 to 4, five entries in the block access table would be required for the group G, only two entries are now needed.

The organization of records into entities facilitates the transfer of multiple records of identical uncompressed size because it reduces the degree of processor intervention which is required during reading and writing. To write a sequence of records contained in an entity only requires processor intervention to form the header portion and to make the appropriate entry in the block access table. In contrast, using the known scheme described with reference to FIGS. 1 to 4 requires processor intervention on a per record basis. This is especially important with data compression, since the compressed byte count is unknown until after the compression process has finished. Thus, when trying to fill up a group with data, the number of records (and corresponding block access table entries) that will fit is unknown. By fixing the block access table requirements at one entry no matter how many records worth of data fit into the group, the entire group may be filled up with a single processor intervention. Similar advantages are afforded when reading data.

Figure 6:
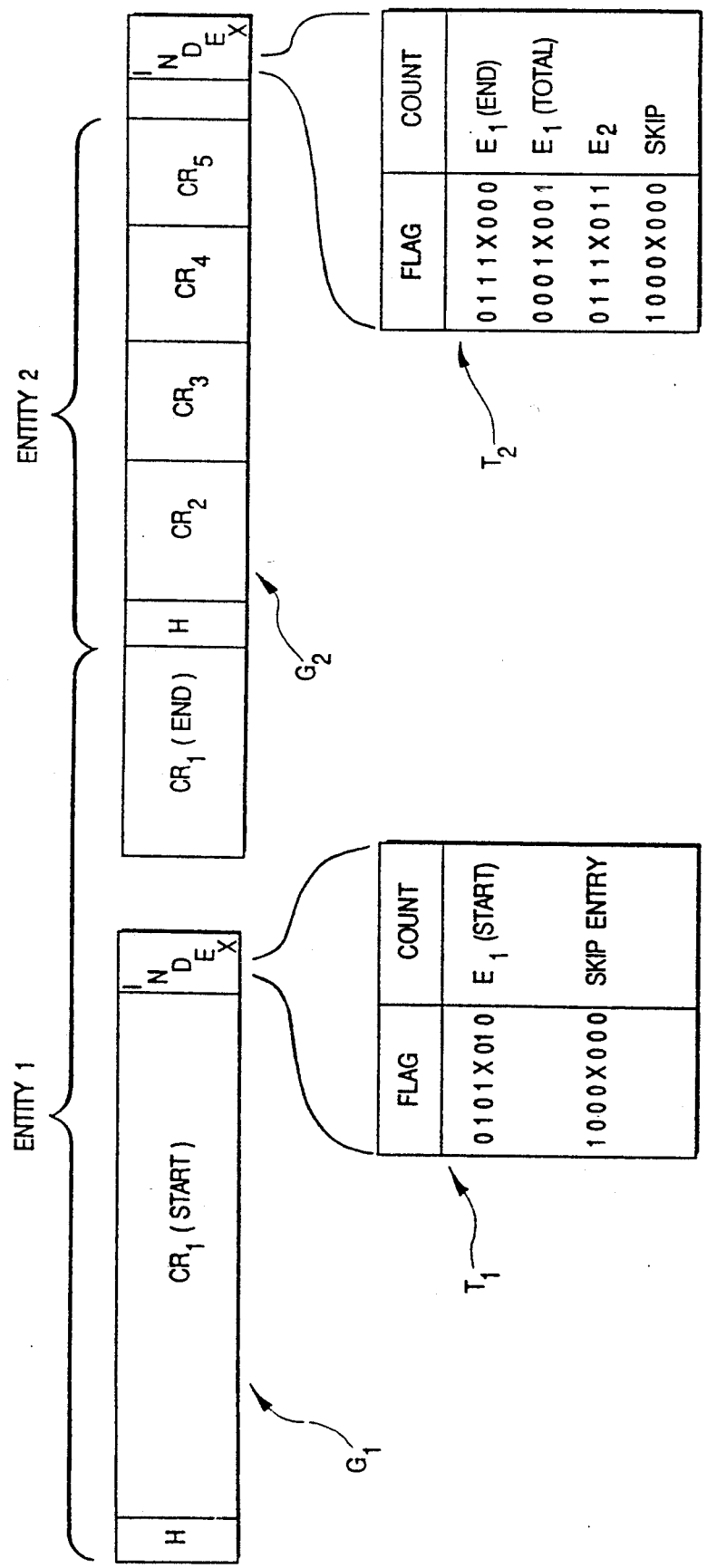

With reference to FIG. 6, an entity (E$_n$) may spread over more than one group e.g. an entity E$_1$ containing a single, relatively long record CR$_1$ fills group G$_1$ and runs over into group G$_2$. The entries in the block access tables T$_1$, T$_2$ of the groups G$_1$, G$_2$ are also shown in FIG. 6. To reduce the degree of linkage between groups, a new entity is started as soon as possible in a group i.e. at the start of the group or at the beginning of the first compressed record in the group if the previous record is uncompressed or at the beginning of the first new compressed record if the previous record is compressed and has run over from the previous group. Therefore, at the end of compressed record CR$_1$, the next entity, E$_2$ begins. Entity E$_2$ contains four compressed records CR$_2$ to CR$_5$ of equal uncompressed length.

Figure 7:
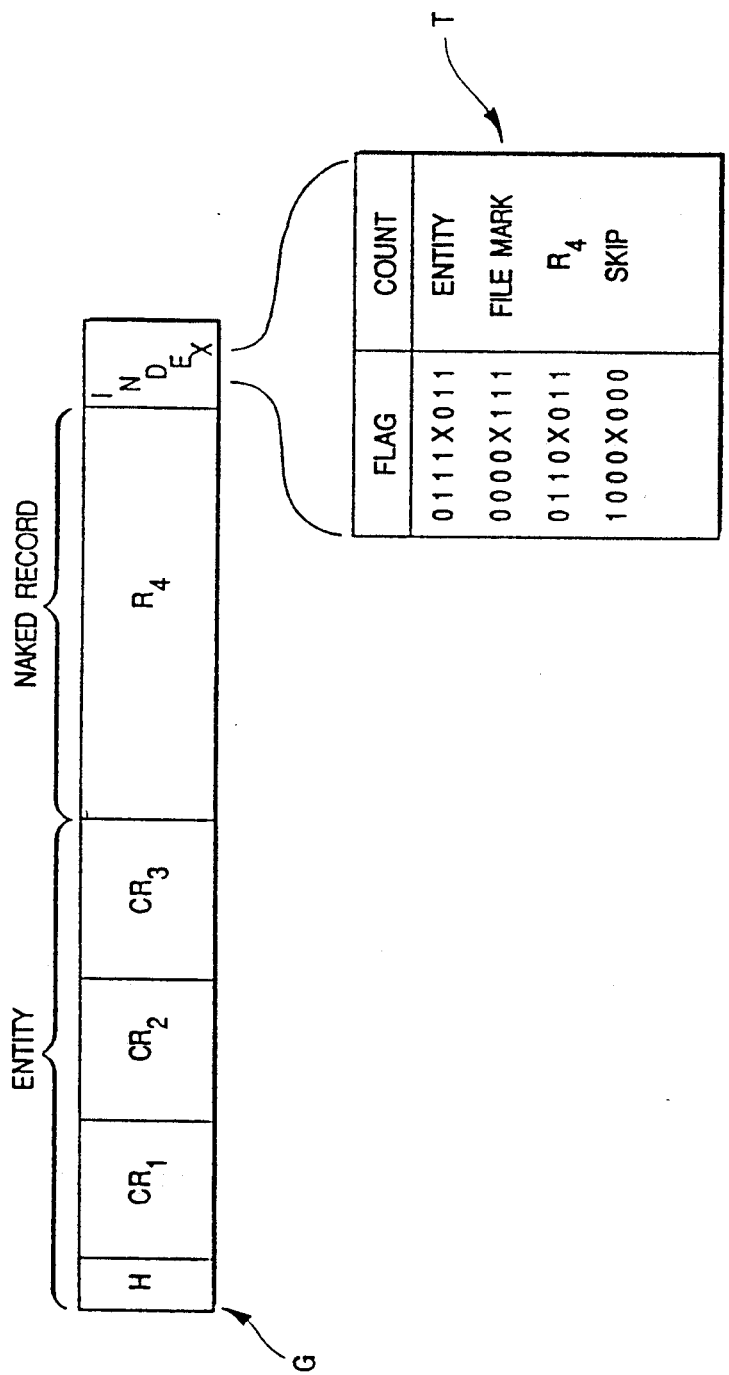

It is envisaged that groups may contain a mixture of entities containing compressed data and "naked records" containing uncompressed data. An example of this arrangement is shown in FIG. 7 which also shows the corresponding entries in the block access table.

A group G contains an entity comprising a header portion H and three compressed records CR$_1$, CR$_2$ and CR$_3$. The group G also comprises an uncompressed record R (which has no header portion). The block access table T of the group G contains four entries:

the first entry is the full byte count of the entity in the group;

the second entry is a file mark entry (which indicates the presence of a file mark in the incoming data before the start of record R$_4$);

the third entry is the full byte count of the uncompressed record R$_4$;

the last entry is a SKIP entry.

It will be noted from FIG. 7 that the CMP bit (the fourth bit of the FLAG field) is set for the entity byte count entry but not for the naked record byte count entry. A suitably configured non-DC drive can identify compressed and uncompressed data on a tape having a mixture of such data by checking whether the CMP bit is set in the relevant block access table entries.

In this scheme, no separator marks are allowed within an entity. For example, if a host is sending a sequence of equal length records to a DC tape drive and there is a file mark or other separator mark within that sequence, then the first set of records before the separator mark will be placed in one entity, the separator mark will be written to tape and the set of records in the sequence which follow the file mark will be placed in a second entity. The corresponding entries for the two entities and the separator mark will of course be made in the block access table of the relevant group (assuming that only one group is involved in this example).

Figure 8:
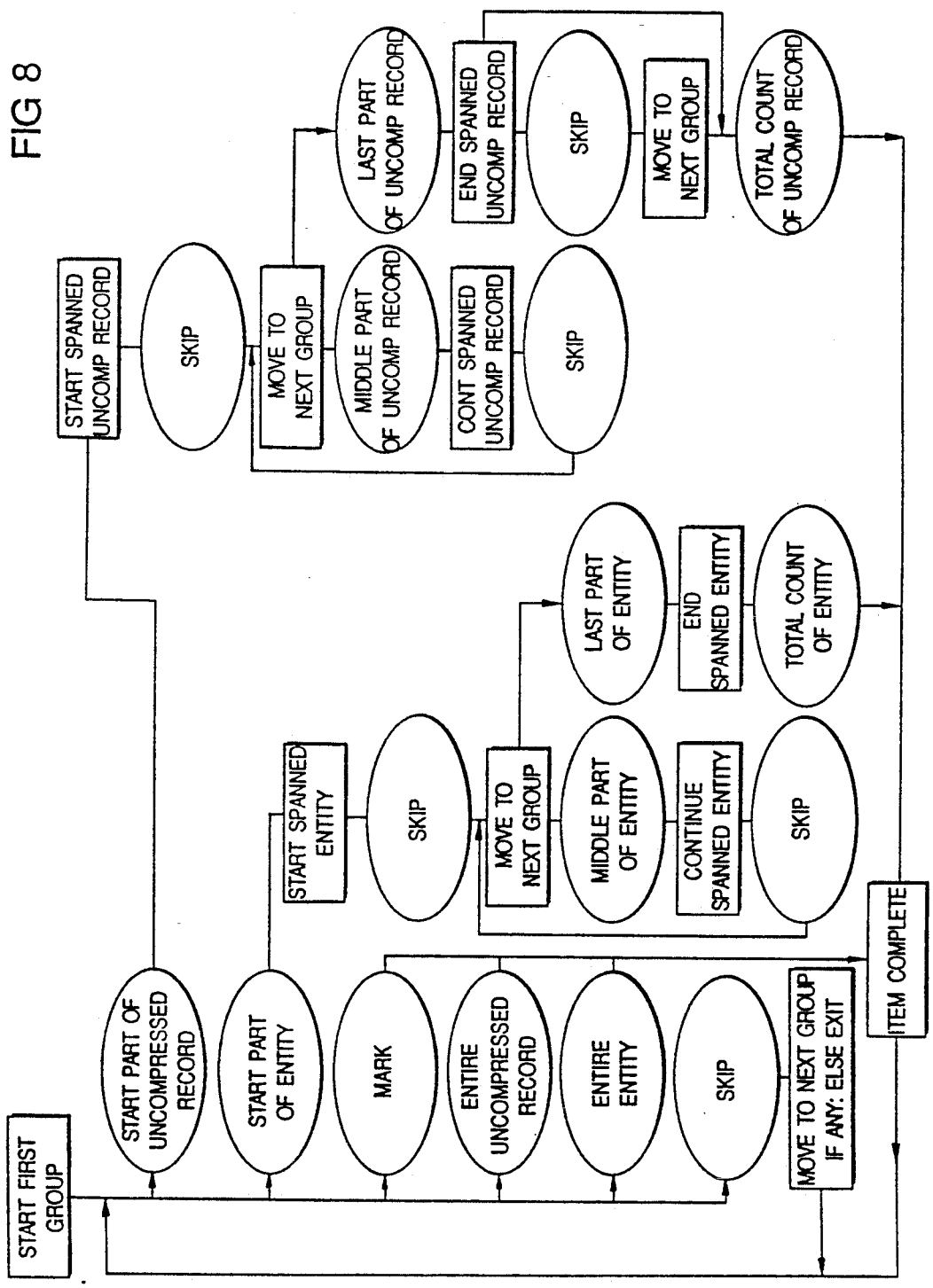
FIG. 8 is a diagram illustrating possible valid entries for the block access table of a group.

Some valid sequences of entries in the block access table of a group are illustrated in FIG. 8. In FIG. 8, states and actions are designated by rectangles and block access table entries are designated by ellipses. A 'spanned' record/entity is one which extends over from one group into another.

To account for the existence of entities and the permitted existence of multiple compressed records within an entity, certain fields in the group information table in the index of each group are defined as follows:

Record Count—this field is a 4-byte field which specifies the sum of the values of the Number of Records in Current Group entry (see below) of the group information table of all groups written since BOR, up to and including the current group.

Number of Records in Current Group—this field is a 2-byte field which specifies the sum of the following:
  i) the number of Separator Mark entries in the block access table of the current group.
  ii) the number of Total Count of uncompressed record entries in the block access table of the current group.
  iii) the number of Full Count uncompressed record entries in the block access table of the current group.
  iv) the sum of the numbers of compressed records within all entities for which there is a Total Count of Entity entry or Full Count of Entity entry in the block access table of the current group.
  v) the number, minus one, of compressed records in the entity for which there is a Start Part of Entity entry in the block access table of the current group, if such an entry exists.
  vi) the number of Total Count of Entity entries in the block access table of the current group.

Group Number of the Previous Record—this field is a 2-byte field which specifies the running number of the highest-numbered previous group in which a separator mark, an access point or the beginning of an uncompressed record occurred. It shall contain all ZERO bits if no such previous group exists.

With regard to the organization of records in fixed size groups as described with reference to FIGS. 1 to 8 it is generally desirable to keep the groups independent from one another for decompression purposes (i.e. it is generally desirable to RESET the dictionary at or near the beginning of each group). One reason for this are to help reduce the amount of buffer space which is required in the controller by decreasing the linkages between groups (i.e. to make it less likely to have to store more than one group in the buffer at any one time). Another reason for a dictionary RESET at the beginning of a group is that, when it is desired to selectively decompress a record in the middle of a group it is not necessary to go outside the group to start the relevant dictionary.

There are advantages in having a FLUSH codeword after each record—the FLUSH codeword is also called the "end of record" (EOR) codeword, so as to improve the access to compressed data. This feature enables records to be decompressed individually, subject to the need to decompress from the RESET point which precedes the record. Having a FLUSH codeword at the end of each record means that the data for each record can be decompressed without running into the data from the next record. This feature is also useful when it is desired to append new records to a point in the middle of existing records.

Figure 9:
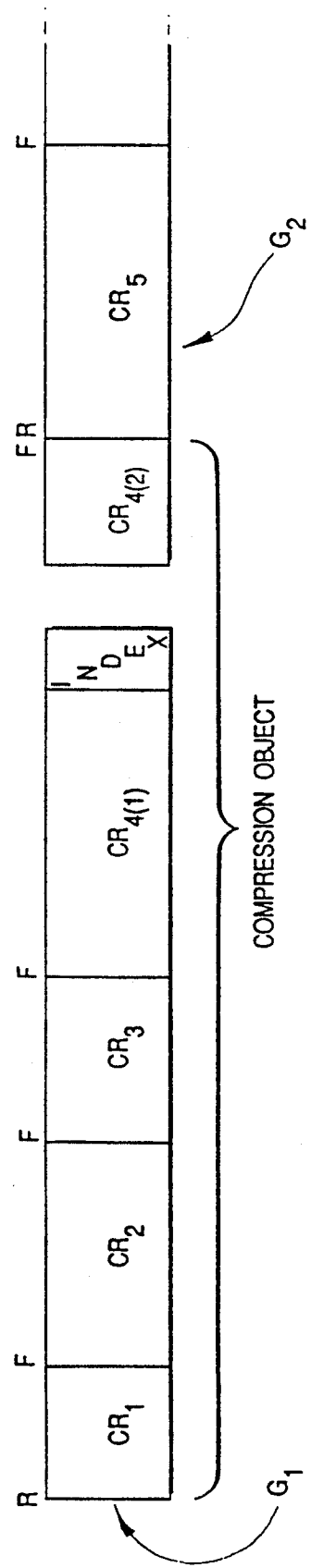
FIGS. 9 and 10 are diagrams of alternative schemes for storing computer data.

The amount of compressed data which makes up a data dictionary is termed a "compression object". A compression object may encompass more than one group of data as illustrated in FIG. 9. Where a record overlaps from one group to the next, a RESET codeword is placed in the data stream at the beginning of the very next compressed record.

In FIG. 9 a Group G comprises three full compressed records $CR_1$, $CR_2$, $CR_3$ and the first part of a fourth compressed record $CR_4$. The last part of record $CR_4$ extends into the next group $G_2$. The records are not organized into entities in this example.

During data compression, the dictionary is reset (indicated by R in FIG. 9) at the beginning of group $G_1$. FLUSH codewords (indicated by F) are inserted into the datastream at the end of each record. The current dictionary continues until record $CR_4$ ends at which time the dictionary is reset. Thus the current compression object comprises records $CR_1$–$CR_4$. The advantages of allowing a dictionary to extend over more than one record of unequal uncompressed length in terms of increased efficiency of data compression are therefore obtained.

If it is later desired selectively to decompress, say, record $CR_3$, this can be achieved by beginning decompression at the start of record $CR_1$ (i.e. the start of the compression object containing record $CR_3$), and decompressing data until the end of record $CR_3$. A 'clean break' at the end of record $CR_3$ can be achieved without running over into the start of record $CR_4$ due to the FLUSH codeword at the end of record $CR_3$.

Thus, providing FLUSH codewords which are accessible by the format interspersed between 'access points' (i.e. RESET codewords accessible by the format) enables selective decompression of segments of data which are smaller than the amount of data used to build a dictionary during data compression. The FLUSH codewords at the end of records are accessible since the compressed byte counts for each record are stored in the block access table.

The start of a compression object which forms an 'access point' (i.e. a point at which the drive can start a decompression operation), may be denoted in one of several ways. Access points may be explicitly noted in the block access table of each group. Alternatively, the presence of an access point may be implied by another entry in the block access table (e.g. the very presence of an algorithm number entry may imply an access point at the beginning of the first new record in that group). Alternatively, a bit in the algorithm number may be reserved to indicate that a new dictionary starts at the beginning of the first new record in that group.

Figure 10:
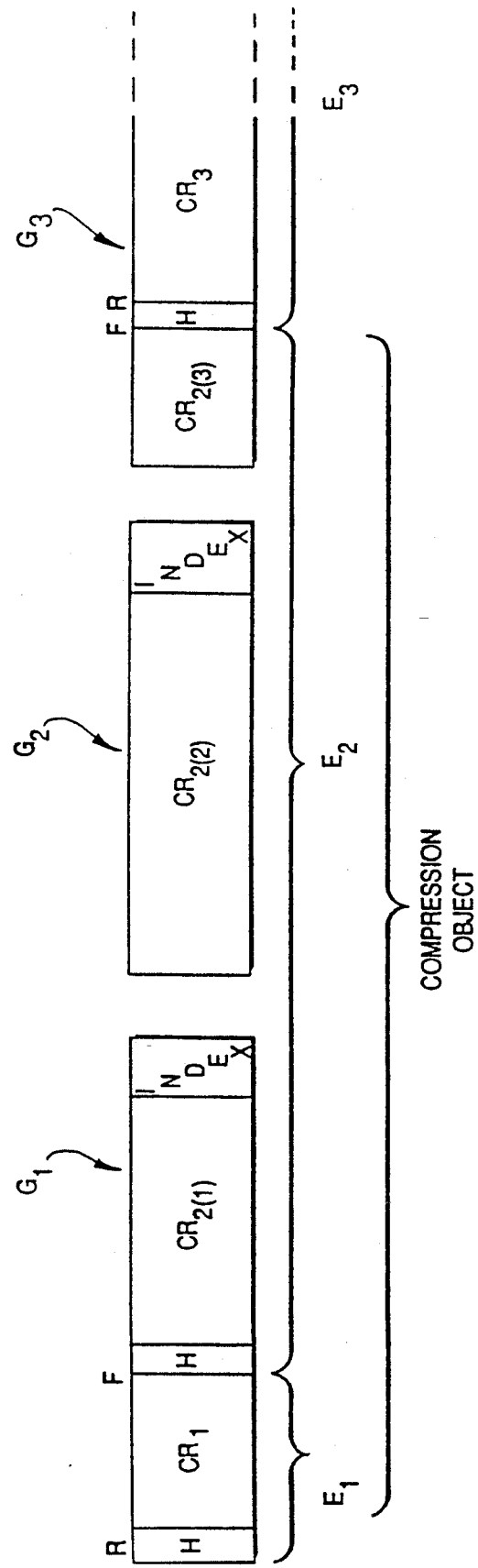

When records are organized into entities and entities are organized into groups as described with reference to FIGS. 5 to 7, a compression object may encompass more than one entity as illustrated in FIG. 10, so as to obtain the advantage of dictionary sharing over entities which contain relatively small amounts of data.

FIG. 10 shows three fixed size groups $G_1$, $G_2$, $G_3$ of compressed data. Group G contains full record $CR_1$ and the first part of the next record $CR_2$. Record $CR_1$ is the only record in entity $E_1$. Group $G_2$ contains the middle part of record $CR_2$. Group $G_3$ contains the end part of record $CR_2$ and contains further records $CR_3$ etc. Entity $E_2$ contains a single, relatively long record $CR_2$.

During compression, the dictionary is reset (denoted by R) at the beginning of group G but, since record $CR_1$ is relatively small, the compression object continues beyond record $CR_1$ and entity $E_1$ and includes record $CR_2$ and entity $E_2$. A compression object ends at the end of record $CR_2$ and a new one begins at the beginning of record $CR_3$.

A further possibility is for the presence of a non-zero algorithm number in an entity header to indicate the start of a new dictionary and otherwise for the algorithm number header entry to take a predetermined value e.g. zero.

The presence of a FLUSH codeword at the end of each entity which is accessible owing to writing the compressed byte count of the entity in the block access table enables selective decompression of records on a per entity basis. For example, referring to FIG. 10, the contents of entity $E_2$ (which happen to be a single record $CR_2$ in this example) could be decompressed without obtaining data from the beginning of record $CR_3$. However, decompression must commence from the RESET codeword at the beginning of entity $E_1$ which is the nearest previous dictionary start point which is accessible in the tape format. It is also possible to decompress data on a per record basis utilizing information in the entity header as will be described with reference to FIGS. 20A and 20B.

If each record in an entity comprises a trailer (as mentioned previously with reference to FIG. 5A) which contains the compressed byte count of the record and there are FLUSH codewords at the end of each record, this feature can be used to achieve decompression on a per record basis. I t would be possible for an entire tape to be written so that each compressed record had its own entity. This would improve access to records for selective decompression but involves the overhead of an 8 byte header per record and a 4 byte index entry per record. Also, then multiple record transfers would be slower since processor intervention is required to (at least) skip over the headers of each entity.

It should be appreciated that the DC chip inserts RESET codewords into the datastream in an algorithm-dependent manner—even in the middle of records. The above description relates to the RESET codewords which are forced, recognized and utilized by the tape format.

To clarify, in FIGS. 5 to 10 the entities and compression objects do not include the indices of any relevant group.

A tape format for helical-scan implementation of the present invention will now be described.

The storage method and apparatus described hereinafter utilizes a helical-scan technique for storing data in a format similar to that used for the storage of PCM audio data according to the DAT Conference Standard (March 1988, Electronic Industries Association of Japan, Tokyo, Japan). The present method and apparatus is, however, adapted for storing computer data rather than digitized audio information.

Figure 11:
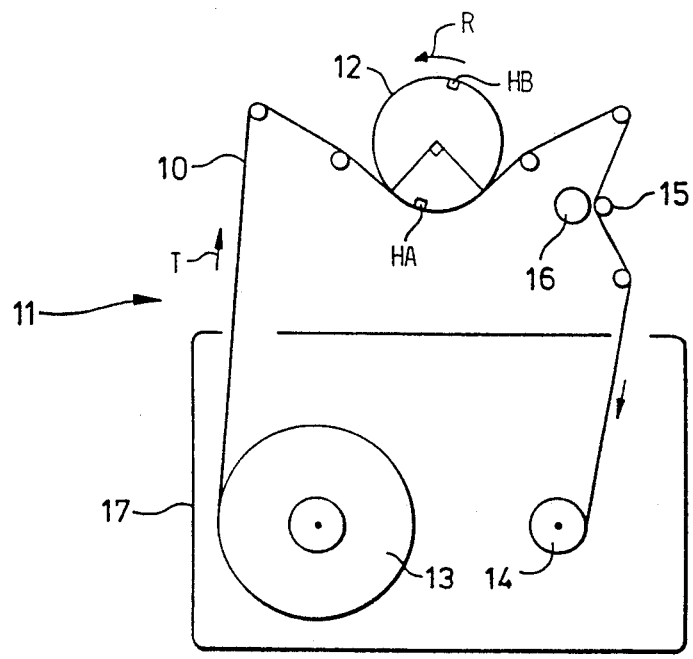
FIG. 11 is a diagram illustrating the main physical components of a tape deck which employs helical scanning and which forms part of the data storage apparatus embodying the invention.
Figure 12:
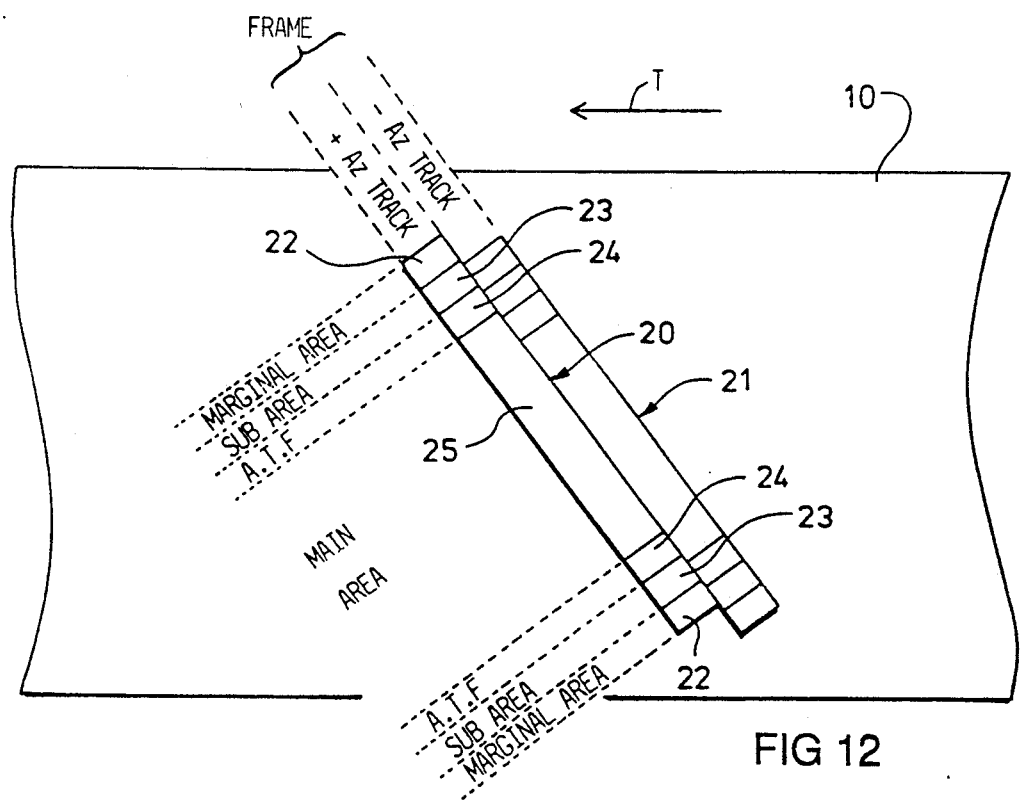
FIG. 12 is a diagrammatic representation of two data tracks recorded on tape using helical scanning.

FIG. 11 shows the basic layout of a helical-scan tape deck 11 in which tape 10 from a tape cartridge 17 passes at a predetermined angle across a rotary head drum 12 with a wrap angle of 90°. In operation, the tape 10 is moved in the direction indicated by arrow T from a supply reel 13 to a take-up reel 14 by rotation of a capstan 15 against which the tape is pressed by a pinch roller 16; at the same time, the head drum is rotated in the sense indicated by arrow R. The head drum 12 houses two read/write heads HA, HB angularly spaced by 180°. In known manner, these heads HA, HB are arranged to write overlapping oblique tracks 20, 21 respectively across the tape 10 as shown in FIG. 12. The track written by head HA has a positive azimuth while that Written by head HB has a negative azimuth. Each pair of positive and negative azimuth tracks, 20, 21 constitutes a frame.

The basic format of each track as arranged to be written by the present apparatus is illustrated in FIG. 12. Each track comprises two marginal areas 22, two sub areas 23, two ATF (Automatic Track Following) areas 24, and a main area 25. The ATF areas 24 provide signals enabling the heads HA, HB to accurately follow the tracks in known manner. The main area 25 is used primarily to store the data provided to the apparatus (user data) although certain auxiliary information is also stored in this area; the sub areas 23 are primarily used to store further auxiliary information. The items of auxiliary information stored in the main and sub areas are known as sub codes and relate for example, to the logical organization of the user data, its mapping onto the tape, certain recording parameters (such as format identity, tape parameters etc), and tape usage history.

A more detailed description of the main area 25 and sub areas 23 will now be given including details as to block size that are compatible with the aforementioned DAT Conference Standard.

The data format of the main area 25 of a track is illustrated in FIG. 13. The main area is composed of 130 blocks each thirty six bytes long. The first two blocks 26 are preambles which contain timing data patterns to facilitate timing synchronization on playback. The remaining 128 blocks 27 make up the 'Main Data Area'. Each block 27 of the Main Data Area comprises a four-byte 'Main ID' region 28 and a thirty-two byte 'Main Data' region 29, the compositions of which are shown in the lower part of FIG. 13.

The main ID region 28 is composed of a sync byte, two information-containing bytes W1, W2 and a parity byte. Byte W2 is used for storing information relating to the block as a whole (type and address) while byte W1 is used for storing sub codes.

The Main Data region 29 of each block 27 is composed of thirty two bytes generally constituted by user-data and/or user-data parity. However, it is also possible to store sub codes in the Main Data region if desired.

The data format of each sub area 23 of a track is illustrated in FIG. 14. The sub area is composed of eleven blocks each thirty-six bytes long. The first two blocks 30 are preambles while the last block 31 is a post-amble. The remaining eight blocks 32 make up the "Sub Data Area". Each block 32 comprises a four-byte 'Sub ID' region 33 and a thirty-two byte 'Sub Data' region 34, the compositions of which are shown in the lower part of FIG. 14.

The Sub ID region 33 is composed of a sync byte, two information-containing bytes SW1, SW2 and a parity byte. Byte SW2 is used for storing information relating to the block as a whole (type and address) and the arrangement of the Sub Data region 34. Byte SW1 is used for storing sub codes.

The Sub Data region 34 of each block 32 is composed of thirty two bytes arranged into four eight-byte "packs" 35. These packs 35 are used for storing sub codes with the types of sub code stored being indicated by a pack-type label that occupies the first half byte of each pack. The fourth pack 35 of every even block may be set to zero or is otherwise the same as the third pack while the fourth pack of every odd block is used to store parity check data for the first three packs both of that block and of the preceding block.

In summary, user data is stored in the Main Data regions 29 of the Main Data Area blocks 27 of each track while sub codes can be stored both in the Sub ID and Sub Data regions 33, 34 of Sub Data Area blocks 32 and in the Main ID and Main Data regions 28, 29 of Main Data Area blocks 27.

For the purposes of the present description, the sub codes of interest are an Area ID sub code used to identify the tape area to which particular tracks belong, and a number of sub codes used for storing counts of records and separator marks. The area ID sub code is a four-bit code stored in three locations. Firstly, it is stored in the third and fourth packs 35 of the Sub Data region 34 of every block in the Sub Data Areas of a track. Secondly, it is stored in byte SW1 of the Sub ID region 33 of every even Sub Data Area block 32 in a track, starting with the first block. The tape areas identified by this sub code will be described later on with reference to FIG. 15.

The sub codes used to store record and separator mark counts are stored in the first two packs 35 of the Sub Data region 34 of every block in the sub Data Areas of each track within the Data Area of the tape (see later with reference to FIG. 15). These counts are cumulative counts which are the same as the counts in the group information table as previously described. These counts are used for fast searching the tape and to facilitate this process are constant over a set of frames constituting a group, the counts recorded in the tracks of a group of frames being the counts applicable as of the end of the group.

The general organization of frames along the tape as implemented by the present storage method and apparatus will be considered next. Thus, referring to FIG. 15, the tape can be seen to be organized into three main areas, namely a lead-in area 36, a data area 37 and an end-of-data (EOD) area 38. The ends of the tape are referenced BOM (beginning of media) and EOM (end of media). User data is recorded in the frames of data area 37. The lead-in area 36 includes an area between a beginning-of-recording BOR mark and the data area 37 where system information is stored. The Area ID sub code enables the system area, data area 37 and EOD area 38 to be distinguished from one another.

The frames 48 of the data area are arranged in groups 39 each of a fixed number of frames (for example, twenty two); optionally, these groups are separated from each other by one or more amble frames of predetermined content. In terms of organization of user data records, these groups 39 correspond to the group 3 described with reference to FIG. 1(c). Thus, the placement of user data into such groups 39 has no relation to the logical segmentation of the user data and information relating to this segmentation (record marks, separator marks) is stored in an index 40 that terminates the user-data in a group (the index actually occupies user data space within the group). Note that although the index is shown in FIG. 15 as occupying the final portion of the last frame of the group, this is only correct in relation to the arrangement of data prior to a byte-interleaving operation that is normally effected before data is recorded on tape; however, for present purposes, the interleaving operation can be disregarded.

In practice the information in the index is physically dispersed within the main data areas of the tracks in the group.

The contents of the index 4 are shown in FIG. 2 and, as previously described, the index comprises two main data structures, namely a group information table and a block access table. The group information table is stored in a fixed location at the end of the group and is the same size independent of the contents of the group. In contrast, the block access table varies in size depending on the contents of the group and extends from the group information table backwards into the remainder of the user data area of the frames of the group. Entries are made in the block access table from the group information table backwards to the boundary with real user data or 'pad'.

Figure 15:
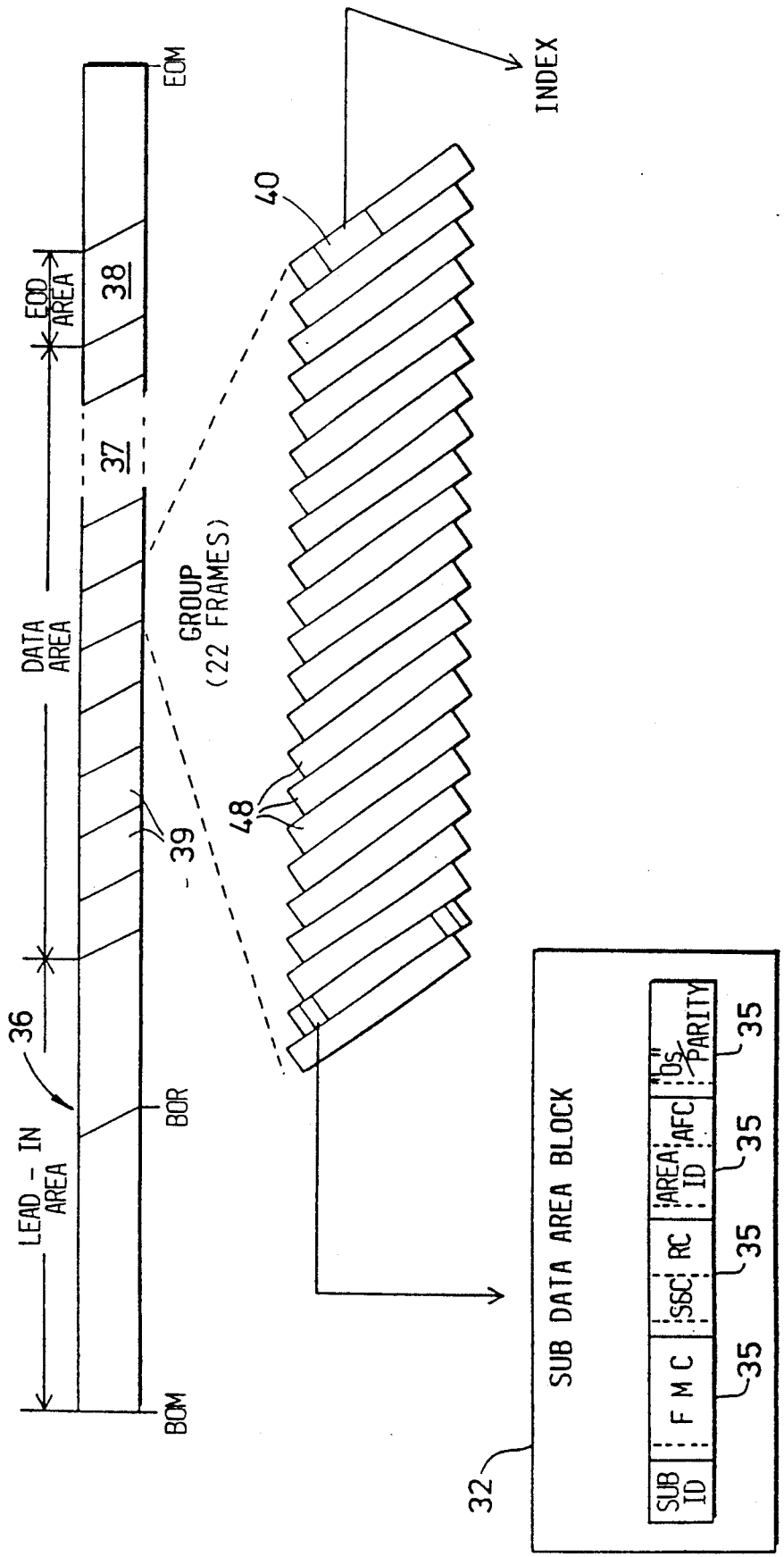
FIG. 15 is a diagram showing both the arrangement of data frames in groups within a data area of a tape and details of an index recorded within each group of frames in accordance with the present invention.

Also shown in FIG. 15 are the contents of a sub data area block 32 of a track within a data-area group 39. As previously noted, the first two packs contain a separator mark count, the second pack 35 also contains record counts RC (as defined above), and the third pack 35 contains the Area ID and an absolute frame count AFC. For all the tracks in a group, the counts FMC, and RC held in the sub data area blocks are the same as those held in the group information table 41 of the group index 40.

Figure 16:
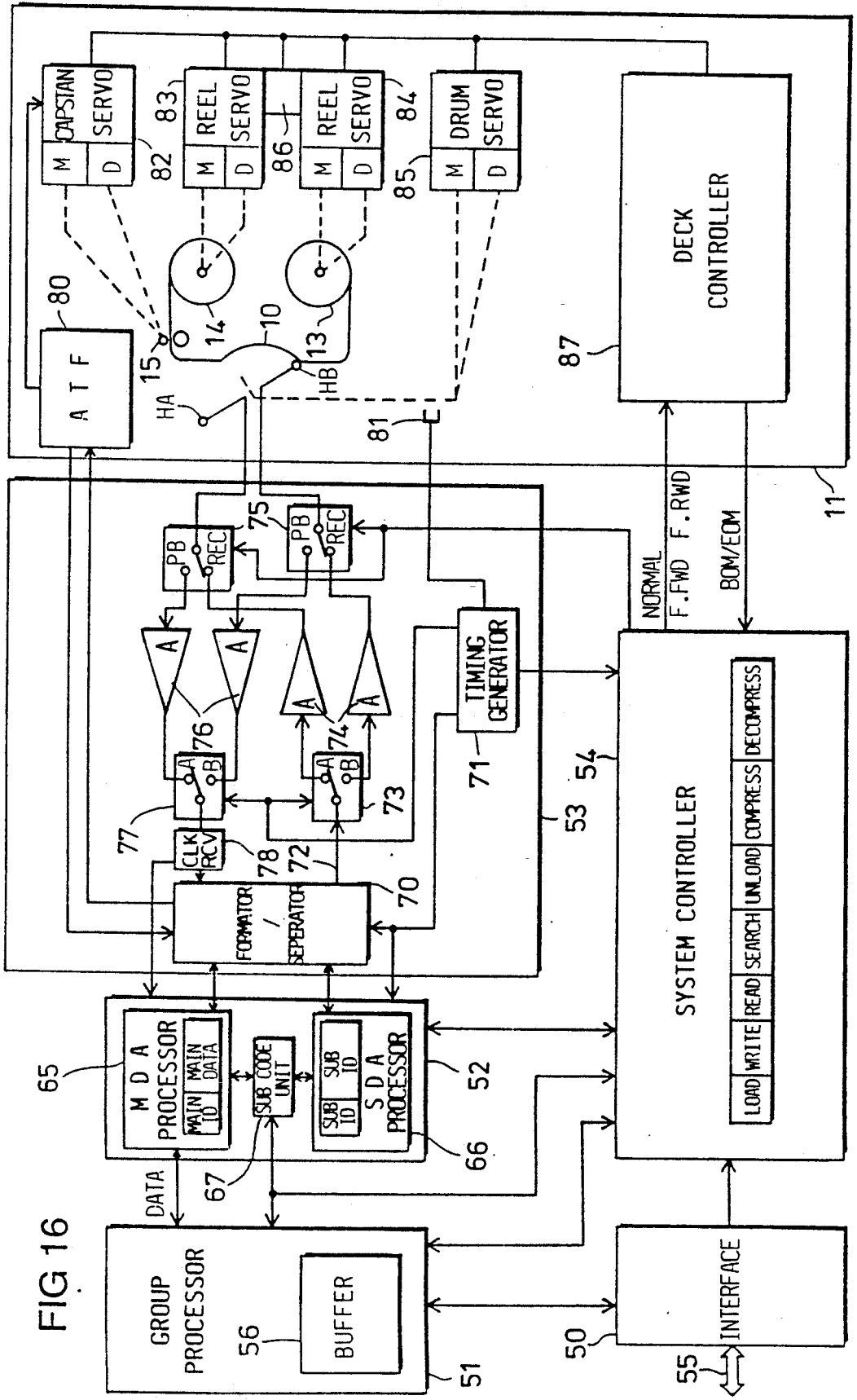
FIG. 16 is a block diagram of the main components of the data storage apparatus embodying the invention.

FIG. 16 is a block diagram of the storage apparatus for compressing and recording user data in accordance with the above-described tape format. The apparatus includes the tape deck 11 already described in part with reference to FIG. 11. In addition to the tape deck, the apparatus includes an interface unit 50 for interfacing the apparatus with a host computer (not shown) via a bus 55; a group processor 51 comprising a data compression processor (DCP) and a frame data processor 52 for processing user-record data and separation data into and out of the Main Data Area and Sub Data Area blocks 27 and 32; a signal organizer 53 for composing/decomposing the signals for writing/reading a track and for appropriately switching the two heads HA, HB; and a system controller 54 for controlling the operation of the apparatus in response to commands received from a computer via the interface unit 50. Each of the main component units of the apparatus will be further described below.

Firstly, the structure and operation of the data compression processor (DCP) or data compression engine will be described.

Figure 17:
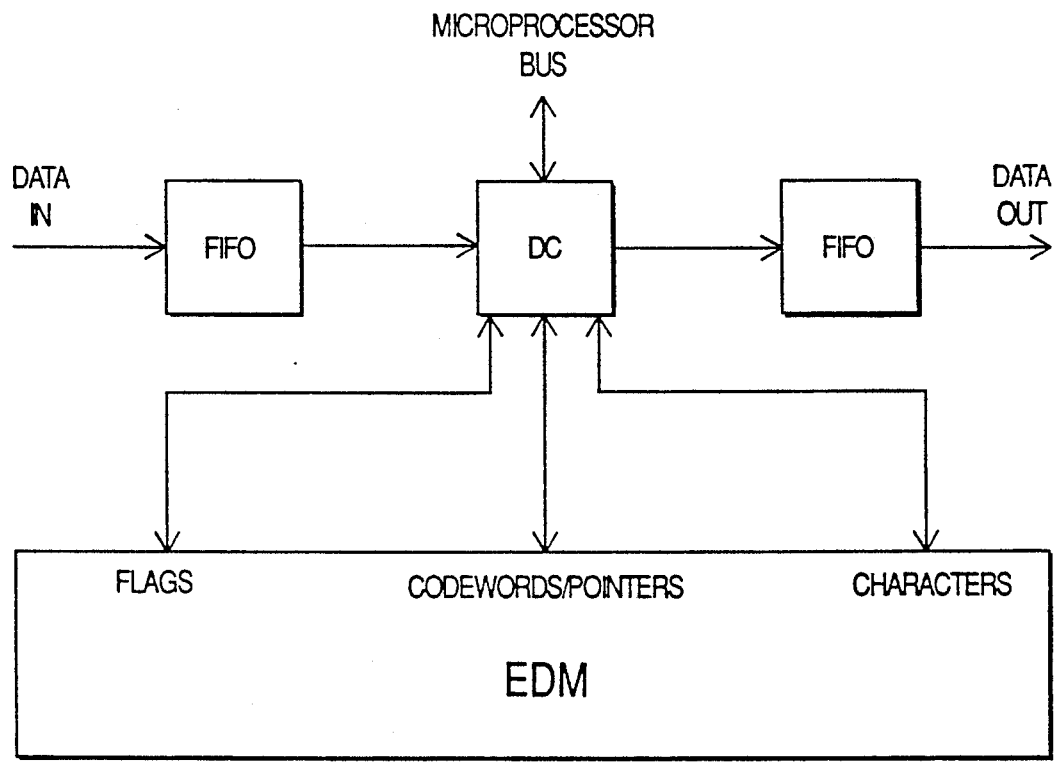
FIGS. 17 and 18 are block diagrams relating to the data compression processor.

With reference to FIG. 17 the heart of the engine is a VLSI data compression chip (DC chip) 100 which can perform both compression and decompression on the data presented to it according to the LZW algorithm. However, only one of the two processes (compression or decompression) can be performed at any one time. Two first-in, first-out (FIFO) memories 102 are located at the input and the output of the DC chip to smooth out the rate of data flow through the chip. The data rate through the chip is not constant, since some data patterns will take more clock cycles per byte to process than other patterns. The instantaneous data rate depends upon the current compression ratio and the frequency of dictionary entry collisions, both of which are dependent upon the current data and the entire sequence of data since the last dictionary RESET. The third section of the subsystem is a bank of static RAM forming an external dictionary memory (EDM) 104 that is used for local storage of the current dictionary entries. These entries contain characters, codeword pointers, and control flags.

Figure 18:
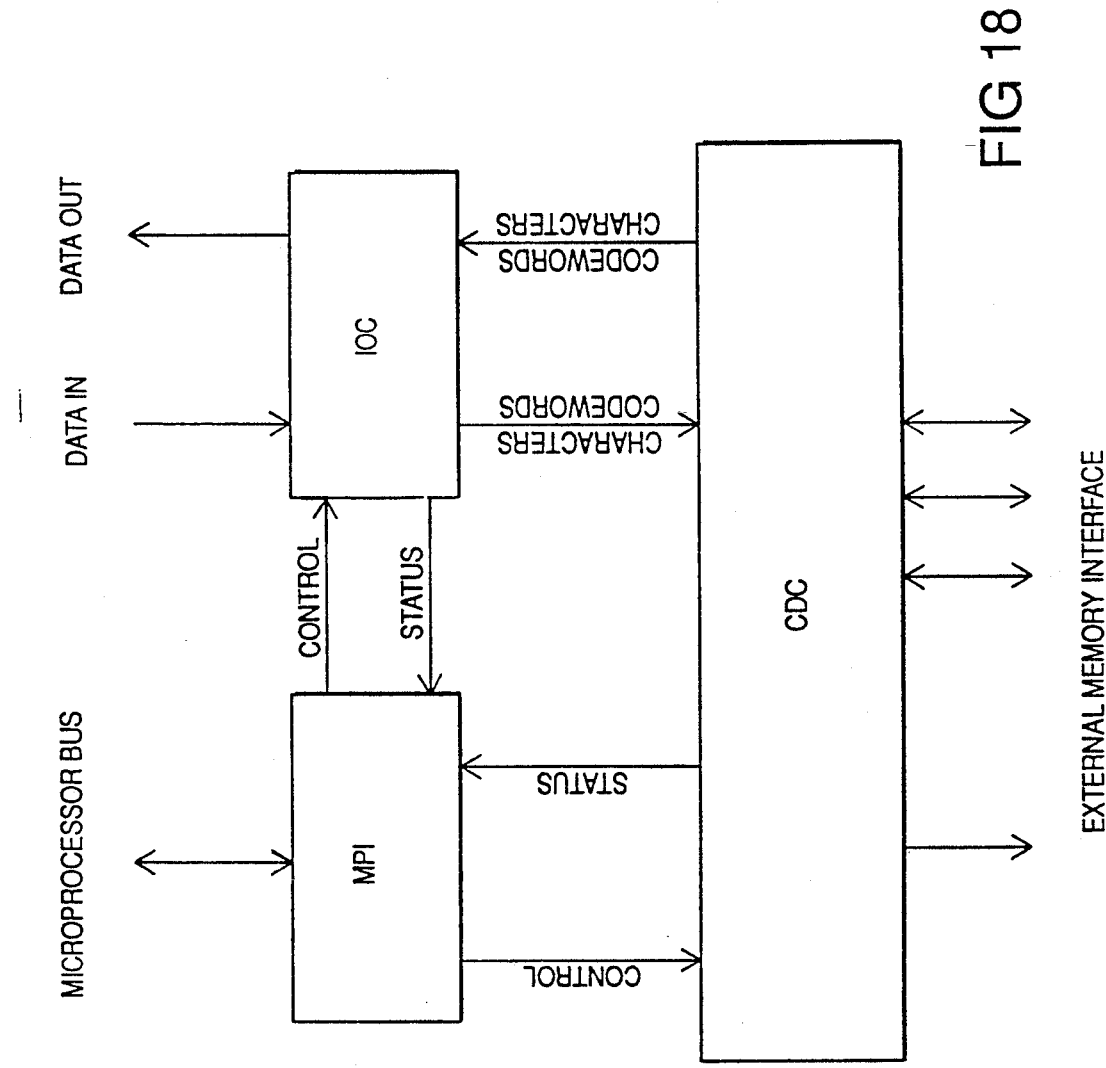

FIG. 18 shows a block diagram of the DC integrated circuit. The DC chip 100 is divided into three blocks; the input/output converter (IOC) 106, the compression and decompression converter (CDC) 108, and the microprocessor interface (MPI) 110.

The MPI 110 provides facilities for controlling and observing the DC chip 100. It contains six control registers, eight status registers, two 20 bit input and output byte counters, and a programmable automatic dictionary reset circuit. The control and status registers are accessed through a general-purpose 8 bit microprocessor interface bus. The control registers are used to enable and disable various chip features and to place the chip into different operating modes (compression, decompression, pass through, or monitor). The status registers access the 20 bit counters and various status flags within the chip.

It has been found that compression ratios can be improved by resetting the dictionary fairly frequently. This is especially true if the data stream being compressed contains very few similar byte strings. Frequent dictionary resets provide two important advantages. First, resetting the dictionary forces the codeword length to return to 9 bits. Second, new dictionary entries can be made that reflect the present stream of data (a form of adaption). The DC chip's interface section contains circuitry that dynamically monitors the compression ratio and automatically resets the dictionary when appropriate. Most data compression algorithms will expand their output if there is little or no redundancy in the data.

The IOC 106 manages the process of converting between a byte stream and a stream of variable-length codewords (ranging from 9 bits to 12 bits). Two of the eight reserved codewords are used exclusively by the IOC 106. One of these codewords is used to tell the IOC 106 that the length of the codewords must be incremented by one. Thus, the process of incrementing codeword size is decoupled from the CDC 108—the IOC 106 operates as an independent pipeline process, thus allowing the CDC 108 to perform compression or decompression without being slowed down by the IOC 106.

The second reserved codeword which is the FLUSH (or 'end of record' (EOR) ) codeword alerts the IOC that the next codeword is the last one associated with the current packet of data (i.e. the FLUSH codeword is actually the penultimate one of a compressed record). Based on this information, the IOC 106 finishes its packing routine and ends on a byte boundary. This feature allows compression of multiple input packets into one contiguous output packet while maintaining the ability to decompress this packet into its constituent packets. The IOC 106 is also capable of allowing data to pass straight through from input to output without altering it, and of allowing data to pass through while monitoring the potential compression ratio of the data. These features can be used as another level of expansion protection.

The CDC 108 is the engine that performs the transformation from uncompressed data to compressed data and vice versa. This section is composed of control, data path, and memory elements that are adjusted for maximum data throughput. The CDC 108 interfaces with the IOC 106 via two 12 bit buses 105. During compression, the IOC 106 passes the input bytes to the CDC 108 where they are transformed into codewords. These codewords are sent to the IOC 106 where they are packed into bytes and sent out of the chip. Conversely, during decompression the IOC 106 converts the input byte stream into a stream of codewords, then passes these codewords to the CDC 108 where they are transformed into a stream of bytes and sent to the IOC 106. The CDC 108 also interfaces directly to the external RAM that is used to store the dictionary entries.

The CDC 108 makes use of two reserved codewords. The first is used any time a dictionary reset has taken place. The occurrence of this codeword causes two actions: the IOC 106 returns to the state in which it packs or unpacks 9-bit codewords, and the CDC 108 resets the current dictionary and starts to build a new one. Dictionary resets are requested by the MPI 110 via microprocessor control or the automatic reset circuitry. The second reserved codeword is generated during compression any time the CDC 108 runs out of usable external RAM while trying to build a new dictionary entry. This event very rarely happens, given sufficient external RAM. However, as the amount of memory decreases, it is more likely that the CDC 108 will encounter too many dictionary collisions and will not be able to build new dictionary entries. With the reduction of external memory and the inevitable increase in dictionary collisions, the data throughput and compression performance will be slightly degraded. This "full dictionary" codeword is also used during decompression by the CDC 108 to ensure that the decompression process stops building dictionary entries at the same point as the compression process.

Returning now to FIG. 16 the data storage apparatus is arranged to respond to commands from a computer to load/unload a tape, to store a data record or separation mark, to enable compression of data, to search for selected separation marks or records, and to read back the next record.

The interface unit 50 is arranged to receive the commands from the computer and to manage the transfer of data records and separation marks between the apparatus and computer. Upon receiving a command from the computer, the unit 50 passes it on to the system controller 54 which, in due course, will send a response back to the computer via the unit 50 indicating compliance or otherwise with the original command. Once the apparatus has been set up by the system controller 54 in response to a command from the computer to store or read data, then the interface unit 50 will also control the passage of records and separation marks between the computer and group processor 51.

During data storage the group processor 51 is arranged to compress the user-data if required and to organize the user-data that is provided to it in the form of data records, into data packages each corresponding to a group of data. The processor 51 is also arranged to construct the index for each group and the corresponding sub codes. During reading, the group processor effects a reverse process enabling data records and separation marks to be recovered from a group read from tape prior to decompression.

Figure 19:
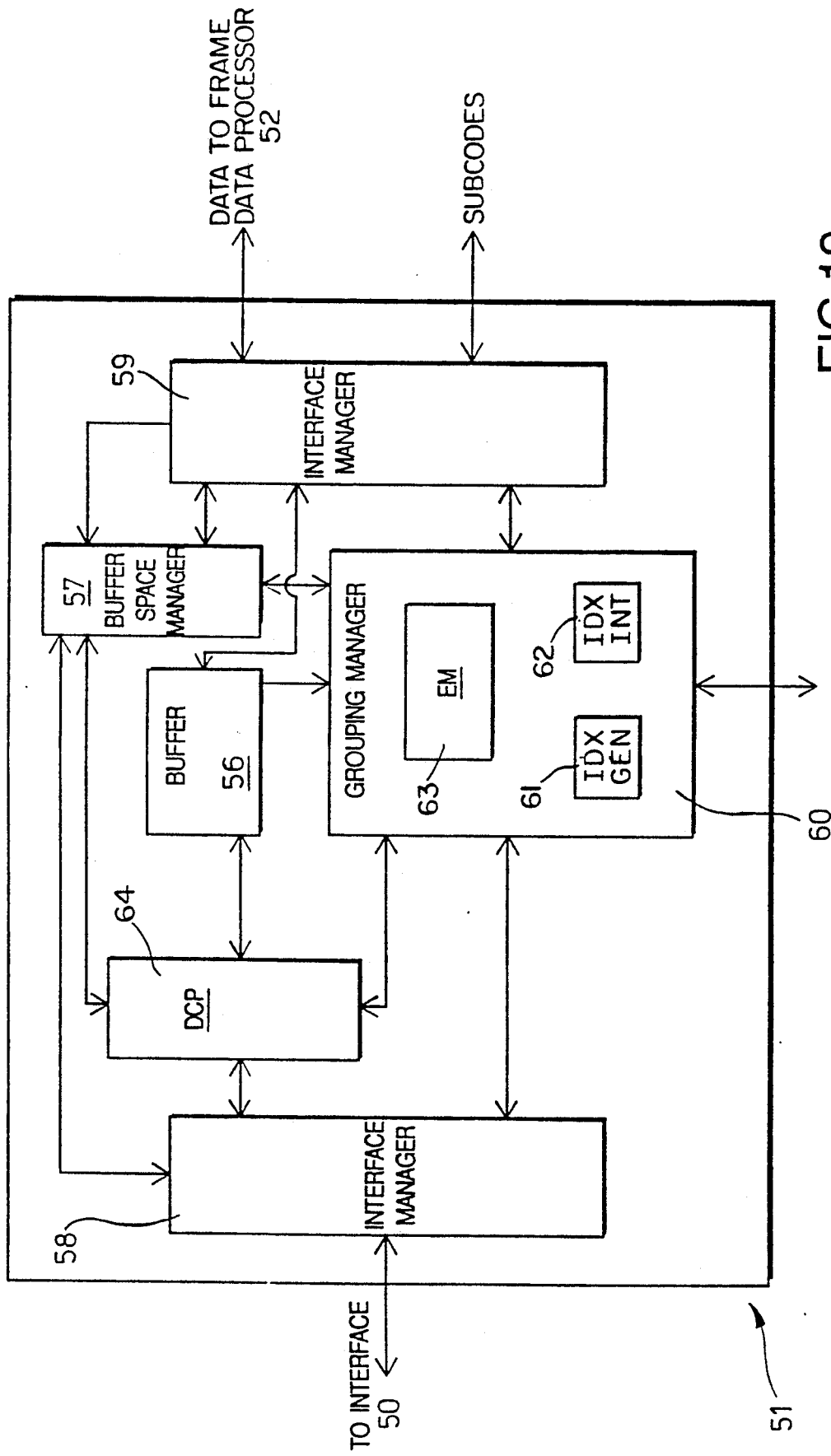
FIG. 19 is more detailed functional block diagram of a group processor of the data storage apparatus.

The form of the group processor 51 is shown in FIG. 19. At the heart of the group processor 51 is a buffer 56 which is arranged to hold more than one group's worth of data. The allocation of buffer space to incoming and outgoing data is controlled by a buffer space manager 57. The processor 51 communicates with the interface 50 via a first interface manager 58 and with the frame data processor 52 via a second interface manager 59. Overall control of the grouping process is effected by a grouping manager 60 which also generates the group indices and associated codes during recording (functional block 61) and interprets these indices and sub codes during reading (functional block 62). The grouping manager 60 is arranged to exchange coordination signals with the system controller 54.

The DC processor (DCP) 64 is operable to compress data for storage on tape or to decompress data to be read by a host. There are interconnections between the DCP 64 and the interface manager 58, the buffer 56, the buffer space manager 57 and the grouping manager 60 for the interchange of control signals.

The grouping manager 60 also comprises an entity manager (EM) 63 which organizes compressed data into entities and generates header portions for the entities. The grouping manager 60 and the buffer space manager 57 are control components and data for writing to tape does not pass through them, but rather passes directly from the buffer 56 to the interface manager 59.

During recording when the host is ready to pass a data record, the interface 50 asks the buffer space manager 57 (via the interface manager 58) whether the processor 51 is ready to receive the record. The buffer space manager 57 may initially send a 'wait' reply but, in due course, enables the transfer of the data record from the host to the buffer 56.

If the data is to be compressed (according to control signals from the system controller 54), the DCP 64 substitutes codewords for a proportion of the data in the record in accordance with a data compression algorithm as previously described.

The insertion of accessible RESET and FLUSH codewords at particular points in the datastream can be programmed into the DCP 64 if these can be specified in a simple manner (e.g. reset after each record). Alternatively, the insertion of RESET and FLUSH codewords according to the format can be governed by the system controller 54 (e.g. there can be FLUSH codewords automatically inserted at the end of each record and RESET codewords inserted according to signals from the system controller 54).

FIG. 19 can be termed an "inline" system, (i.e. where the DCP 64 is placed between an interface manager 58 and a buffer 56). During compression, data flows from the interface manager 58 through the DC processor into the buffer 56. During decompression, data flows from the buffer 56 through the DCP 64 to the interface manager 58. There is no significant buffering between the interface manager 58 and the DCP 64.

It is convenient from a system perspective to have a "flushed" state during compression. (e.g., X bytes in then Y bytes out). It is likewise convenient to have the same flushed state during decompression. (e.g., Y bytes in then X bytes out). The boundary at which these can and should occur is the same as during compression. By outputting a special FLUSH codeword during compression, and flushing whenever it is detected during decompression, a compression/decompression system obtains several advantages.

A write to a buffer without a DC system would entail setting up and completing a transfer of N bytes from the interface manager into the buffer. With DC, this becomes two transfers N bytes to the DC processor, and M bytes from it to the buffer. When the transfer is completed, it is desirable for all the data corresponding to the transfer to be in the buffer. Therefore, the DC system should be flushed.

A read from the buffer would involve setting up a transfer of N bytes from the buffer to the interface manager. With a DC system, this becomes a transfer of M bytes from the buffer 56 to the DCP 64 and a transfer from it to the interface manager 58. When the transfer is completed, it is again desired that the DCP 64 be flushed.

Typically, a host transfers records one at a time although multiple record transfers make sense for shorter records.

In the present system, the RESET and the FLUSH functions are independent. Note that none of the above implies anything about resetting the dictionary. The FLUSH function is truly separate from that of RESET. By separating them, the boundaries between transfers can be introduced into the data without affecting the dictionary and having the subsequent effects on the compression ratios and throughput. The DC system can be flushed before a dictionary is completely built, so that even short-record systems can enjoy the benefits of a full dictionary. If a "good" dictionary is built which is giving very good compression ratios, it need not be re-built during subsequent records. When RESET is tied to FLUSH, these advantages are lost.

The grouping manager 60 is connected to the buffer space manager 57 and prompts the buffer space manager 57 to determine how much more data the group can take before it runs into the index area of the group. The buffer space manager 57 notifies the grouping manager 60 whenever the maximum number of bytes has been transferred into the current group or the last byte from the host has been received.

If a transfer from the host cannot all fit inside a group, it is said to "span" the group boundary. The first part of the transfer goes into one group and the rest into subsequent groups. The buffer space manager 57 tells the grouping manager 60 if the host tries to supply more data than will fit in the current group being built. If no span occurs, the group index is updated and the grouping manager 60 waits for another write command. If a span occurs, the index of the current group is updated and that group is available for writing to tape. The next group is begun and the data from the host goes directly into the beginning of that new group.

The record will be transferred to a buffer location that corresponds to the eventual positioning of the record data within the group of which it is to form a part. Information on the size of the record is passed to the grouping manager 60. When the host sends a separator indication this is also routed to the grouping manager 60. The grouping manager keeps track of the separator mark and record counts from BOR and uses this information in the construction of the index and separation-count and record count sub codes of a group. The index is constructed in a location in the buffer appropriate to its position at the end of a group.

In parallel, the entity manager EM 63 generates an entity header portion for the current entity which will contain the compressed record data. The header portion is not compressed. The EM 63 is responsible for ensuring that the rules governing entity formation are observed. These are:

a) Start a new entity:
  i) as soon as possible after the beginning of a group;
  ii) when the uncompressed size of records being sent from the host changes;
  iii) when the compression algorithm changes. (Regarding i) and iii) above, the need for an access point requires starting a new entity and an appropriate signal is sent to the DCP 64 from the grouping manager 60.)

b) End an entity:
  i) when an uncompressed record is to be stored;
  ii) when a separation mark is to be stored. The formation of each entity triggers a BAT entry.

When a group becomes full, the processes of data compression and entity building halt until a new group is initiated.

If incoming data is not to be compressed, the data passes unchanged through the DCP 64 and the EM 63 is inactive. Uncompressed records are organized directly into groups without forming part of an entity and information regarding the records is put into the group index. Uncompressed records do not have a header portion created for them.

Once a group (including its index and sub codes) has been assembled, it is transferred to the frame data processor 52 for organization into the blocks making up the main data areas and sub data areas of twenty two successive frames. Information about frame ID is in the datastream. There is a continuous stream of data between the group processor 52 to a small buffer in the frame data processor 52 which is able to store three frame's worth of data.

As previously mentioned, it may be desirable to insert one or more amble frames between groups of frames recorded on the tape. This can be done by arranging for the frame data processor 52 to generate such amble frames either upon instruction from the group processor 51 or automatically at the end of a group if the processor 52 is aware of group structure.

By sizing the buffer 56 such that it can hold two group's worth of data, the general operation of the processor 51 can be kept as straight forward as possible with one group being read in and one group being processed and output. During writing, one group is being built with data from a host and one is being written to tape.

When data is being read from tape, the group processor 51 is arranged to receive user-data and sub-codes on a frame-by-frame basis from the frame data processor 52, the data being written into the buffer 56 in such a manner as to build up a group. The group processor 51 can then access the group index to recover information on the logical organization (record/entity structure, separator marks) of the user-data in the group and an indication of whether the data is compressed.

If the data is uncompressed, or the data is compressed but is to be read back to the host in its compressed form for software decompression, the group processor 51 can pass a requested record or separator mark to the host via the interface 50 in which case the data passes through the DCP 64 unchanged. The entity header portions in compressed data are passed back to a host by a non-DC drive for use by the host.

If the data is compressed and is to be decompressed, the data is decompressed by the DCP 64 in the manner described above, before being passed to the host.

The header portions from each entity are utilized by a DC drive but are not passed to the DCP 64. The algorithm number in the header portion is checked for consistency with the algorithm used by the DCP 64. Further, the number of compressed records in the entity is obtained from the header portion enabling a record count down to be performed as the entity data is passed to the DCP 64.

To facilitate the assembly of frame data back into a group's worth of data, each frame can be tagged with an in-group sequence number when the frame is written to tape. This in-group number can be provided as a sub code that, for example, is included at the head of the main data region of the first block in the Main Data Area of each track of a frame. The subcode is used on reading to determine where the related frame data is placed in the buffer 56 when passed to the group processor 51.

The frame data processor 52 functionally comprises a Main-Data-Area (MDA) processor 65, a Sub-Data-Area (SDA) processor 66, and a sub code unit 67 (in practice, these functional elements may be constituted by a single microprocessor running appropriate processes).

The sub code unit 67 is arranged to provide subcodes to the processors 65 and 66 as required during writing and to receive and distribute sub codes from the processors 65, 66 during reading. Depending on their information contents, sub codes may be generated/required by the group processor 51 or the system controller 54; the separation mark count sub codes are, for example, determined/used by the group processor 51 while the Area ID sub codes are determined/used by the controller 54. In the case of non-varying sub codes such as certain writing parameters, the sub codes may be permanently stored in the unit 67. Furthermore, any frame-dependent sub codes may conveniently be generated by the sub code unit 67 itself.

The MDA processor 65 is arranged to process a frame's worth of user data at a time together with any relevant sub codes. Thus during recording, the processor 65 receives a frame's worth of user-data from the group processor 51 together with sub codes from the unit 67. On receiving the user-data the processor 65 interleaves the data, and calculates error correcting codes, before assembling the resultant data and sub codes to output the Main-Data-Area blocks for the two tracks making up a frame. In fact before assembling the user data with the sub codes, scrambling (randomizing) of the data may be effected to ensure a consistent RF envelope independent of the data contents of a track signal.

During reading, the processor 65 effects a reverse process on the two sets of Main-Data-Area blocks associated with the same frame. Unscrambled, error-corrected and de-interleaved user data is passed to the group processor 51 and sub codes are separated off and distributed by the unit 67 to the processor 51 or system controller 54 as required.

The operation of the SDA processor 66 is similar to the processor 65 except that it operates on the sub codes associated with the sub-data-areas of a track, composing and decomposing these sub codes into the from Sub-Data-Area blocks.

The signal organizer 53 comprises a formatter/separator unit 70 which during recording (data writing) is arranged to assemble Main-Data-Area blocks and Sub-Data-Area blocks provided by the frame data processor 52 together with ATF signals from an ATF circuit 80, to form the signal to be recorded on each successive track. The necessary pre-amble and post-amble patterns are also inserted into the track signals where necessary by the unit 70. Timing signals for coordinating the operation of the unit 70 with rotation of the heads HA, HB are provided by a timing generator 71 fed with the output of a pulse generator 81 responsive to head drum rotation. The track signals output on line 72 from the unit 70 are passed alternately to head HA and head HB via a head switch 73, respective head drive amplifiers 74, and record/playback switches 75 set to their record positions. The head switch 73 is operated by appropriately timed signals from the timing generator 71.

During playback (data reading) the track signals alternately generated by the heads HA and HB are fed via the record/playback switches 75 (now set in their playback positions), respective read amplifiers 76, a second head switch 77, and a clock recovery circuit 78 to the input of the formatter/separator unit 70. The operation of the head switch 77 is controlled in the same manner as that of the head switch 73. The unit 70 now serves to separate off the ATF signals and feed them to the circuit 80, and to pass the Main-Data- 0 Area blocks and Sub-Data-Area blocks to the frame data processor 52. Clock signals are also passed to the processor 52 from the clock recovery circuit 78.

The switches 75 are controlled by the system controller 54.

The tape deck 11 comprises four servos, namely a capstan servo 82 for controlling the rotation of the capstan 15, first and second reel servos 83, 84 for controlling rotation of the reels 14, 15 respectively, and a drum servo 85 for controlling the rotation of the head drum 12. Each servo includes a motor M and a rotation detector D both coupled to the element controlled by the servo. Associated with the reel servos 83, 84 are means 86 for sensing the beginning-of-media (BOM) and end-of media (EOM); these means 86 may for example be based on motor current sensing, as the motor current of whichever reel is being driven to wind in tape (dependent on the direction of tape travel) will increase significantly upon stalling of the motor at BOM/EOM.

The tape deck 11 further comprises the automatic track following circuit 80 for generating ATF signals for recordal on tape during recording of data. During reading, the ATF circuit 80 is responsive to the ATF track signal read from tape to provide an adjustment signal to the capstan servo 82 such that the heads HA, HB are properly aligned with the tracks recorded on the tape. The tape deck 11 also includes the pulse generator 81 for generating timing pulses synchronized to the rotation of the heads HA, HB.

The operation of the tape deck 11 is controlled by a deck controller 87 which is connected to the servos 82 to 85 and to the BOM/EOM sensing means 86. The controller 87 is operable to cause the servos to advance the tape, (either at normal speed or at high speed) through any required distance. This control is effected either by energizing the servos for a time interval appropriate to the tape speed set, or by feedback of tape displacement information from one or more of the rotation detectors D associated with the servos.

The deck controller 87 is itself governed by control signals issued by the system controller 54. The deck controller 87 is arranged to output to the controller 54 signals indicative of BOM and EOM being reached.

The system controller 54 serves both to manage high-level interaction between the computer and storage apparatus and to coordinate the functioning of the other units of the storage apparatus in carrying out the basic operations of Load/Write/Compress/Decompress/Search/Read/Unload requested by the computer. In this latter respect, the controller 54 serves to coordinate the operation of the deck 11 with the data processing portion of the apparatus.

In controlling the tape deck 11, the system controller can request the deck controller 87 to move the tape at the normal read/write speed (Normal) or to move the tape forwards or backwards at high speed, that is Fast Forward (F.FWD) or Fast Rewind (F.RWD). The deck controller 87 is arranged to report arrival of BOM or EOM back to the system controller 54.

An operation to locate a record for decompression will now be described with reference to FIGS. 20A and 20B.

Upon the host issuing a command to decompress a record, the controller 54 generates a search key having a value equal to the record count of the record to be decompressed. The current record count is held in the grouping manager 60 of the group processor 51. Next the tape is advanced (or rewound as appropriate) at high speed (many times faster than normal) while the head drum is rotated at a speed to maintain the relative velocity of the heads HA, HB across the tape at a constant value; in this mode, it is possible to read the sub area of about one track in every three hundred (steps 91a and 91b). Reading track sub areas at speed is a known technique and will therefore not be described in detail.

Figure 20:
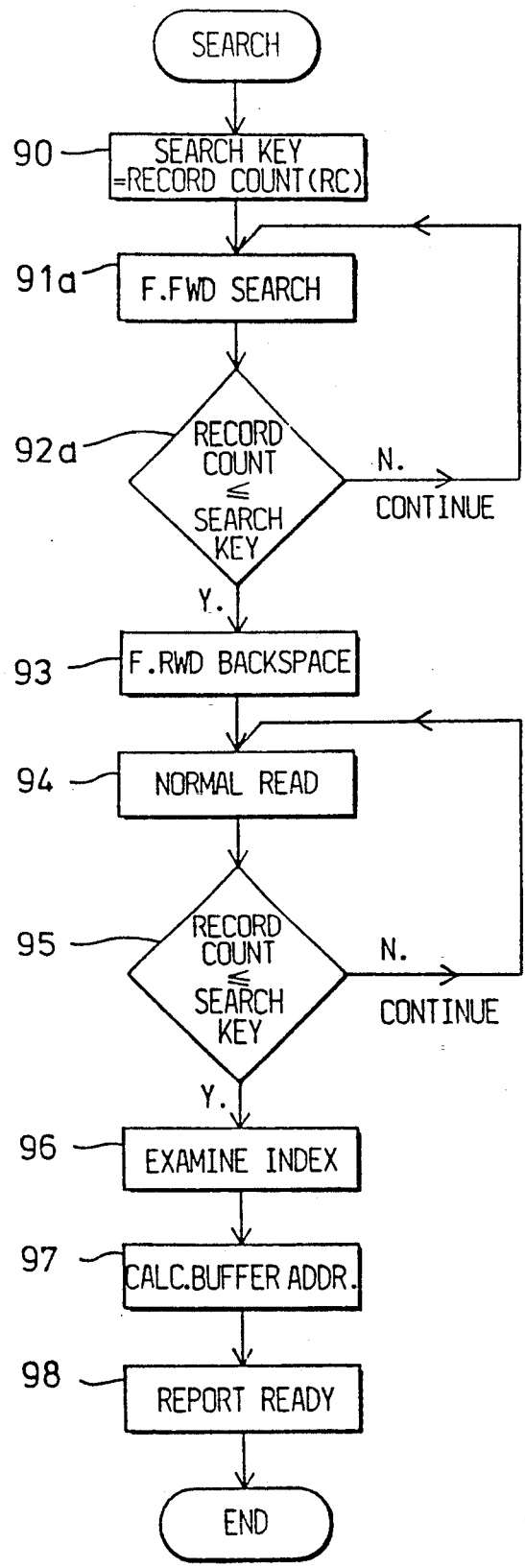
FIGS. 20A and 20B are flow charts of algorithms implemented by the drive apparatus in searching for a particular record on a tape.
Figure 20B:
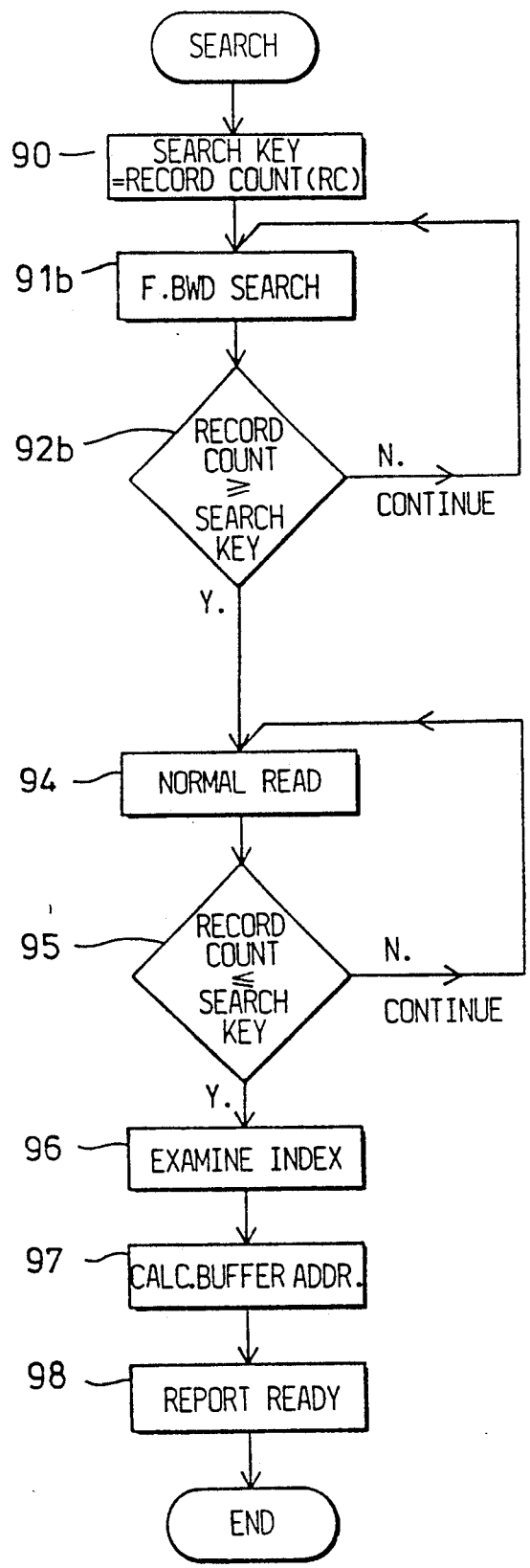

Fast forward searching is depicted in FIG. 20A and fast backward searching is depicted in FIG. 20B.

During fast forward searching (FIG. 20A), for each sub area that is successively read, the record count held in the second pack of each sub data area block is compared by the controller 54 with the search key (step 92a). If the record count is less than the search key, the search is continued; however, if the record count is equal to, or greater than the search key, fast forward searching is terminated and the tape is backspaced through a distance substantially equal to the distance between fast forward reads (step 93). This ensures that the record count held in the sub areas of the track now opposite the head drum will be less than the search key.

During fast backward searching (FIG. 20B), for each sub area that is successively read, the record count held in the second pack of each sub data block is compared by the controller 54 with the search key (step 92b). If the record count is more than the search key, the search is continued; however, if the record count is equal to or less than the search key, the fast rewind is stopped.

Next, for both fast forward and fast backward searching, the tape is advanced at its normal reading speed (step 94),and each successive group is read off tape in turn and temporarily stored in the buffer 56 of the group processor 51. The record count held in the index of each group is compared with the search key (step 95) until the count first equals or exceeds the search key. At this point, reading is stopped as the record searched for is present in the group in buffer 56 whose record count has just been tested. If entries are made in the block access table on a per record basis, the block access table of the index of this group is now examined to identify the record of interest (step 96) and the address in the buffer of the first data record byte is calculated (step 97). Thereafter, the group processor 51 signals the system controller 54 indicating that it has found the searched-for record and is ready to decompress and read the next data record; this is reported back to the host by the controller (step 98). The search operation is now terminated.

It will, of course, be appreciated that other search methods could be implemented.

In order to detect when the bounds of the data area of the tape have been exceeded while searching at speed, whenever a sub area is read the Area ID sub code is checked by the system controller 54. If this sub code indicated that the searching has gone beyond the data area of the tape, then the tape direction is reversed and searching is resumed, generally at a lower speed. For clarity, this Area ID check has been omitted from FIGS. 20A and 20B.

The next step after the record of interest has been located is to check the algorithm number indicating which algorithm was used to compress the data in the record. This is done by examining the block access table of the relevant group if the algorithm number is stored in that table.

If the algorithm number corresponds to the algorithm used by the DC chip in the tape drive (or to one of the DC chips if there is more than one), the next step is to locate the beginning of the compression object containing the record of interest. This may be done in a variety of ways depending on the particular recording format.

Once the beginning of the compression object containing the record of interest is found, decompression commences from that point and continues until the FLUSH (or EOR) codeword at the end of the record is reached. The decompressed record can then be passed to the host. The presence of a FLUSH codeword at the end of the record means that the record can be decompressed cleanly without obtaining data from the beginning of the next record.

If compressed records are organized into entities, the group of interest is located as described earlier with reference to FIGS. 20A and 20B.

The relevant entity can then be located by using the #RECS entries in the entity headers within the group. Decompression is started from the nearest previous access point which may be found by checking the algorithm ID entry in the relevant entity and, if it indicates that the compressed data in that entity is a continuation of an earlier started dictionary, skipping back to the previous entity header and so on until an access point is found. Only decompressed data obtained from the relevant record or records is retained. The existence of data in the entity headers therefore has the advantage of facilitating finding relevant records and access points and allows the process of data management to be decoupled from that of decompression. If there are trailers provided after each compressed record in an entity which contain the compressed byte count of the record, these CBCs can be utilized to advantage in ascertaining when to start retaining decompressed data rather than (or as well as) counting FLUSH codewords during decompression.

Consequently, the presence of ancillary information in the data stream can be used to advantage in finding selected records, the nearest previous access point and in ascertaining the point at which decompressed data should be kept.

The above search procedure could likewise be used to find a point at which to append new records to overwrite certain existing records.

It should be appreciated that the present invention is not limited to helical-scan data recording. The compression algorithms described are by way of example and the present invention may also be applicable to the storage of data which is compressed according to a different algorithm which involves a dictionary derived from the user data. Thus, those skilled in the art will recognize that modification and variations may be made without departing from the principles of the invention as described herein above and set forth in the following claims.

I claim:

1. A method for compressing user data comprising the steps of:
   receiving a stream of user data organized into a plurality of records;
   compressing the user data according to a compression algorithm by converting selected data to codewords using a dictionary derived from the user data, the user data so compressed being output from said compression algorithm and defining compressed data, said compression algorithm having a flush operation causing said compression algorithm to output substantially all of the selected user data undergoing compression up to a time of said flush operation, irrespective of a degree of compression attained;
   starting a derivation of at least a second dictionary from the user data during compression thereof; and
   carrying out a plurality of said flush operations between the beginning of consecutive dictionaries.

2. A method according to claim 1, comprising the step of carrying out said flush operation at an end of each record.

3. A method according to claim 1, comprising the step of outputting information identifying said flush operations within the compressed data.

4. A method according to claim 1, comprising the step of outputting information identifying the beginning of new dictionaries within the compressed data.

5. A method according to claim 1, comprising the steps of:
   outputting the compressed data in groups independent of a record structure of the user data; and
   beginning one new dictionary substantially at the beginning of each group.

6. A method according to claim 5, comprising the step of beginning one new dictionary at the beginning of a first new record in each group.

7. A method according to claim 5, comprising the steps of:
   organizing user data records into entities, each entity comprising one or more records; and
   carrying out said flush operation at the end of each entity.

8. A method according to claim 5, comprising the steps of:
   organizing user data records into entities, each entity comprising one or more records; and beginning a new dictionary at the beginning of a first new entity in each group.

9. A method according to claim 1, further comprising the step of storing said compressed data on tape.

10. An apparatus for compressing user data comprising:

interface means for receiving a stream of user data organized into a plurality of records;

compression means for compressing the user data according to a compression algorithm involving converting selected user data to codewords using a dictionary derived from the user data, the user data so compressed being output from said compression means and defining compressed data;

said compression means comprising a flush means for effecting a flush operation, said flush operation causing said compression means to output substantially all of the selected user data undergoing compression up to a time of said flush operation, irrespective of a degree of compression attained;

reset means for starting a derivation of at least a second dictionary from the user data during compression thereof; and said flush means being arranged to carry out a plurality of said flush operations between the beginning of consecutive dictionaries.

11. The apparatus according to claim 10, wherein said flush means carries out said flush operation at an end of each record.

12. The apparatus according to claim 10, further comprising identification means for outputting information identifying said flush operations within the compressed data.

13. The apparatus according to claim 10, further comprising identification means for outputting information identifying the beginning of new dictionaries within the compressed data.

14. The apparatus according to claim 10, further comprising grouping means for outputting the compressed data in groups independent of a record structure of the user data, said reset means beginning one new dictionary substantially at the beginning of each group.

15. The apparatus according to claim 14, wherein one new dictionary is begun at the beginning of a first new record in each group.

16. The apparatus according to claim 14, further comprising means for organizing user data records into entities, each entity comprising one or more records, said flush means carrying out said flush operation at the end of each entity.

17. The apparatus according to claim 14, further comprising means for organizing user data records into entities, each entity comprising one or more records, said reset means beginning one new dictionary at the beginning of a first new entity in each group.

18. The apparatus according to claim 10, further comprising means for storing said compressed data on tape.

* * * * *